(12) United States Patent
Hirashima et al.

(10) Patent No.: US 9,792,983 B2
(45) Date of Patent: Oct. 17, 2017

(54) NONVOLATILE SEMICONDUCTOR MEMORY DEVICE AND MEMORY SYSTEM

(71) Applicant: Toshiba Memory Corporation, Tokyo (JP)

(72) Inventors: Yasuhiro Hirashima, Kanagawa (JP); Masaru Koyanagi, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/168,676

(22) Filed: May 31, 2016

(65) Prior Publication Data
US 2017/0125092 A1    May 4, 2017

(30) Foreign Application Priority Data

Oct. 29, 2015  (JP) .................................. 2015-213299

(51) Int. Cl.
*G11C 11/00*       (2006.01)
*G11C 13/00*       (2006.01)

(52) U.S. Cl.
CPC .................................. *G11C 13/004* (2013.01)

(58) Field of Classification Search
CPC ......................... G11C 13/0004; G11C 16/0483
USPC .............................................. 365/148, 185.17
See application file for complete search history.

(56) References Cited

U.S. PATENT DOCUMENTS

| | | | |
|---|---|---|---|
| 7,466,577 B2* | 12/2008 | Sekiguchi | G11C 5/02 257/686 |
| 7,852,675 B2 | 12/2010 | Maejima | |
| 8,274,308 B2 | 9/2012 | McCall et al. | |
| 8,372,720 B2 | 2/2013 | Fukuzumi et al. | |
| 8,952,426 B2 | 2/2015 | Maejima | |
| 9,165,651 B2 | 10/2015 | Hosono | |
| 2004/0100837 A1 | 5/2004 | Lee | |
| 2011/0216613 A1* | 9/2011 | Das | G11C 7/02 365/198 |
| 2011/0284946 A1 | 11/2011 | Kiyotoshi | |
| 2013/0307582 A1* | 11/2013 | Ikeda | G11C 7/10 326/30 |
| 2014/0140152 A1 | 5/2014 | Takeyama et al. | |
| 2014/0160857 A1 | 6/2014 | Oh et al. | |
| 2014/0286110 A1 | 9/2014 | Shimizu et al. | |
| 2015/0023112 A1 | 1/2015 | Eom et al. | |
| 2016/0094222 A1* | 3/2016 | Huang | H03K 19/0005 326/30 |

OTHER PUBLICATIONS

Taiwan Office Action dated May 10, 2017, filed in Taiwan counterpart Application No. 105107648, 13 pages (with translation).

* cited by examiner

*Primary Examiner* — Huan Hoang
(74) *Attorney, Agent, or Firm* — Patterson & Sheridan, LLP

(57) ABSTRACT

A memory device includes a nonvolatile semiconductor memory cell array, a plurality of terminals through which control signals are received to control the memory device, an on-die termination circuit connected to at least one of the terminals and having a variable resistor, and a control circuit. The control circuit is configured to enable the on-die termination circuit in response to an enabling signal to enable the on-die termination circuit, with a resistance of the variable registor at different values depending on whether a control signal is asserted or deasserted when the enabling signal is received.

17 Claims, 24 Drawing Sheets

| REn | ODTEN | Mode |
|---|---|---|
| H | ↑ H | ODT ON (DIN mode) |
| L | ↑ H | ODT ON (DOUT mode) |
| X | L | ODT OFF |

| CEnx | REn | ODTEN | Mode |
|---|---|---|---|
| H | H | ⌐⌐ H | ODT ON (DIN mode) |
| H | L | ⌐⌐ H | ODT ON (DOUT mode) |
| L | X | ⌐⌐ H | ODT OFF |
| X | X | L | ODT OFF |

FIG. 18

| CEnx | REn | ODTEN | Mode |
|------|-----|-------|------|
| H | H | H | ODT ON (DIN mode) |
| H | H→L | H | ODT ON (DIN mode) |
| H | L | H | ODT ON (DOUT mode) |
| H | L→H | H | ODT ON (DOUT mode) |
| L | X | H | ODT OFF |
| X | X | L | ODT OFF |

FIG. 20

| STATE OF MEMORY | FUNCTION OF WPnx TERMINAL |
|---|---|
| Power ON | WRITE PROTECT FUNCTION<br>· WPn = L : WP enable |
| POWER FIXATION | WRITE PROTECT FUNCTION<br>· WPn = H : WP disable |
| AFTER ODT IS SET<br>DUE TO Set Feature | SET ODT AS ODTEN TERMINAL<br>· WPn = L : ODT enable<br>· WPn = H : ODT disable |

FIG. 21

| CEnx | CLE | ALE | WEn | REn | WPnx | Mode |
|---|---|---|---|---|---|---|
| H | L | L | H | H | ↆL | ODT ON (DIN mode) |
| H | L | L | H | L | ↆL | ODT ON (DOUT mode) |
| Other | | | | X | ↆL | Write Protect, ODT OFF |
| X | X | X | X | X | H | ODT OFF |

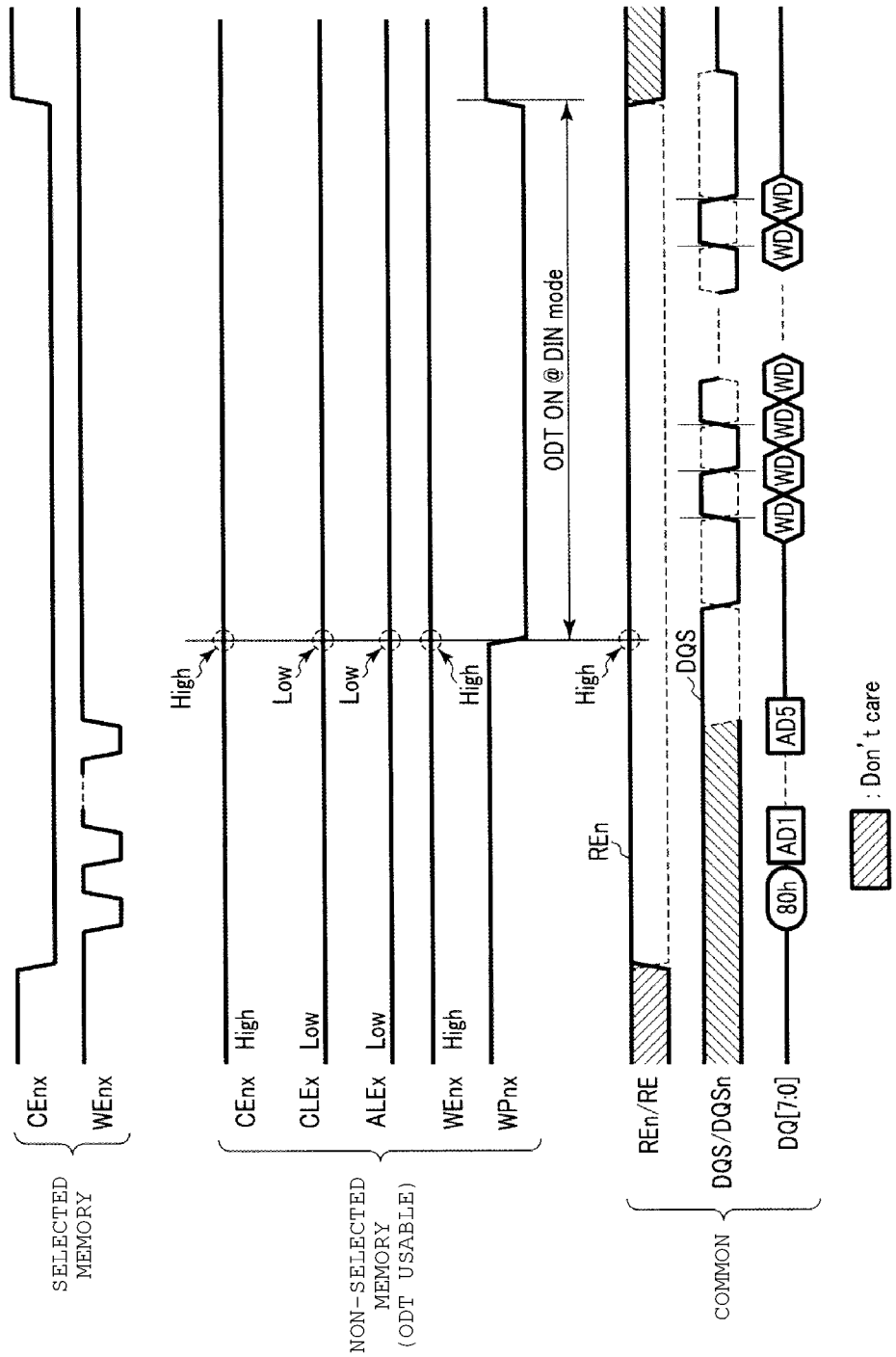

| CEnx | CLEx | ALEx | WEnx | REn | WPnx | Mode |
|---|---|---|---|---|---|---|
| H | L | L | H | H | L | ODT ON (DIN mode) |
| H | L | L | H | H→L | L | ODT ON (DIN mode) |
| H | L | L | H | L | L | ODT ON (DOUT mode) |
| H | L | L | H | L→H | L | ODT ON (DOUT mode) |
| Other | | | | X | L | Write Protect, ODT OFF |
| X | X | X | X | X | H | ODT OFF |

NONVOLATILE SEMICONDUCTOR MEMORY DEVICE AND MEMORY SYSTEM

CROSS-REFERENCE TO RELATED APPLICATION

This application is based upon and claims the benefit of priority from Japanese Patent Application No. 2015-213299, filed Oct. 29, 2015, the entire contents of which are incorporated herein by reference.

FIELD

Embodiments described herein relate generally to a nonvolatile semiconductor memory device and a memory system having the same.

BACKGROUND

A NAND flash memory is known as a nonvolatile semiconductor memory device.

DESCRIPTION OF THE DRAWINGS

FIG. 18 illustrates a relationship between a control mode of an ODT circuit and logic states of various control signals in a memory system according to a fourth embodiment.
FIG. 20 illustrates a relationship between a write protect signal and an operation state of a nonvolatile semiconductor memory device according to a first example of a fifth embodiment.
FIG. 21 illustrates a relationship between logic states of various control signals and a control mode of an ODT circuit in a memory system according to a second example of the fifth embodiment.
FIG. 22 is a timing chart of signals during a write operation carried out in the memory system according to the second example of the fifth embodiment.

DETAILED DESCRIPTION

Figure 1:
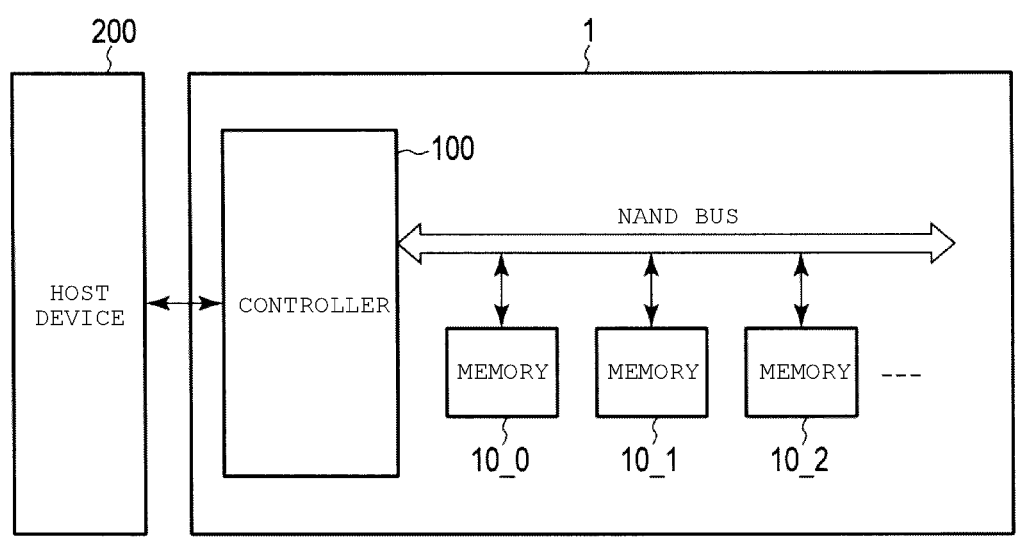
FIG. 1 is a block diagram of a memory system according to a first embodiment.

Certain embodiments provide a nonvolatile semiconductor memory device and a memory system capable of improving processing performance.

In general, according to an embodiment, a memory device includes a nonvolatile semiconductor memory cell array, a plurality of terminals through which control signals are received to control the memory device, an on-die termination circuit connected to at least one of the terminals and having a variable resistor, and a control circuit. The control circuit is configured to enable the on-die termination circuit in response to an enabling signal to enable the on-die termination circuit, with a resistance of the variable resistor at different values depending on whether a control signal is asserted or deasserted when the enabling signal is received.

Hereinafter, embodiments will be described with reference to the drawings. Throughout the drawings, common parts will be assigned common reference numerals in the following description.

1. First Embodiment

A nonvolatile semiconductor memory device and a memory system according to a first embodiment will be described. In the following description, it will be described that a NAND flash memory is used as an example of the nonvolatile semiconductor memory device.

1.1 Configuration

1.1.1 Entire Configuration of Memory System

Initially, the entire configuration of a memory system according to the present embodiment will be described with reference to FIG. 1.

As shown in FIG. 1, a memory system 1 includes, for example, a plurality of NAND flash memories 10 (10_0, 10_1, 10_2, . . . ), and one controller 100.

The plurality of memories 10 is connected to the controller 100 via a NAND bus. The memory 10 is a nonvolatile semiconductor memory device, and is, for example, a NAND flash memory. Each of the memories 10 may include a plurality of memory chips. Here, the memory 10 may use an arbitrary memory chip, and more specifically, the memory may use, for example, various types of NAND flash memory chips. In FIG. 1, three memories 10 are arranged. However, the number of memories is not limited to three, and may be arbitrarily set. In the present embodiment, the NAND flash memory is used as the nonvolatile semiconductor memory device, but the nonvolatile semiconductor memory device is not necessarily limited thereto.

The controller 100 is connected to a host device 200. For example, the controller 100 controls the respective memories 10, or transmits and receives data based on a command from the host device 200.

1.1.2 Configuration of Memory

Hereinafter, the configuration of the memory 10 will be described with reference to FIGS. 2 and 3. Although the memory 10_0 will be described in the following description, the other memories 10 (10_1, 10_2, . . . ) have the same configuration.

Initially, a sectional configuration of the memory 10_0 will be described.

Figure 2:
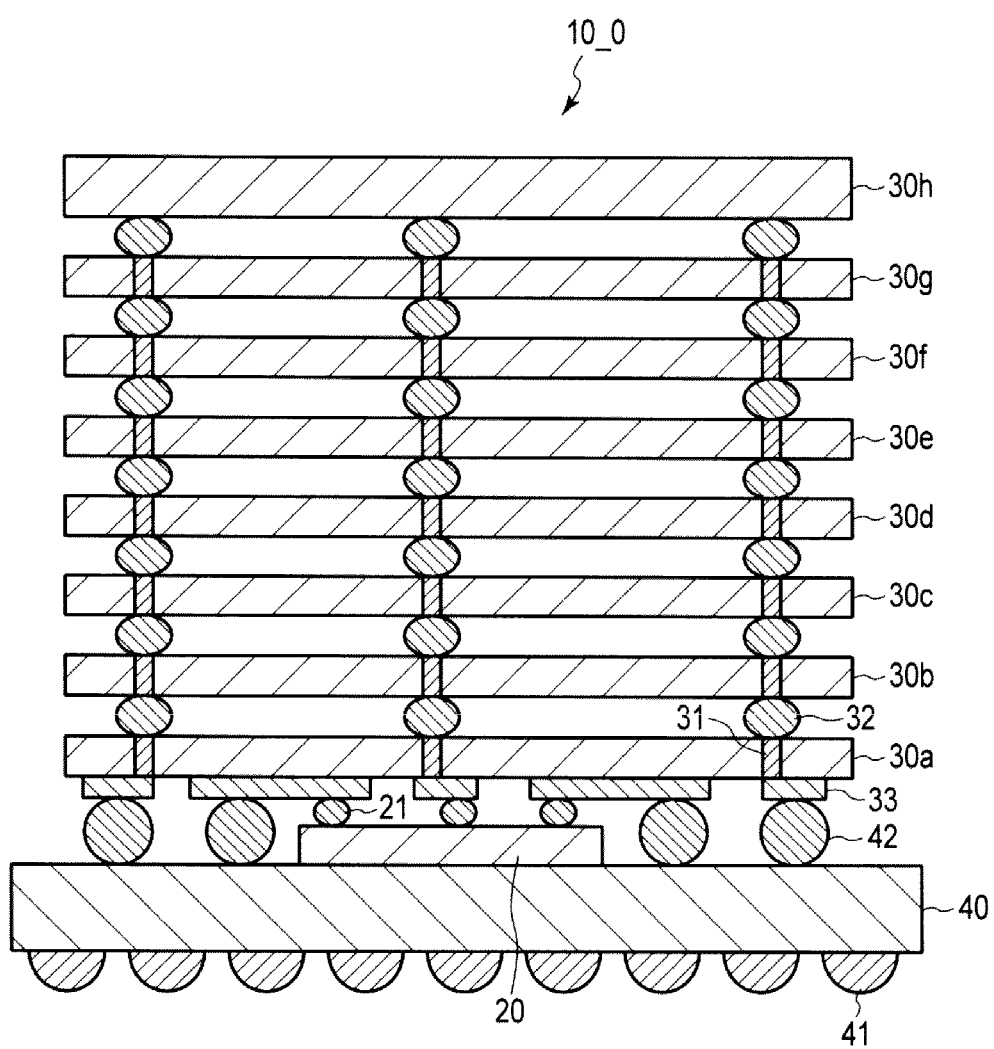
FIG. 2 is a cross-sectional view of a nonvolatile semiconductor memory device of the memory system according to the first embodiment.

As shown in FIG. 2, the memory 10_0 includes a package substrate 40, an interface chip 20, and a plurality (for example, 8) of memory chips 30 (30a to 30h). For example, the interface chip 20 and the plurality of memory chips 30 are sealed on the package substrate 40 by a mold resin (not shown).

The package substrate 40 mounts the interface chip 20 and the memory chips 30. The package substrate 40 supplies, for example, a power supply voltage VCC and a ground voltage VSS to the memory chips 30 and the interface chip 20. The package substrate 40 transmits data between the controller 100 and the interface chip 20.

The interface chip 20 transmits data between the package substrate 40 and each memory chip 30.

The memory chip 30 stores data from the controller 100. In FIG. 2, the eight memory chips 30 (30a to 30h) are layered. However, the number of memory chips is not limited to eight, and may be arbitrarily set.

Hereinafter, the cross-sectional configuration of the memory 10_0 will be described in more detail.

Bumps 41 are formed on a bottom surface of the package substrate (semiconductor substrate) 40. When the nonvolatile semiconductor memory device is a ball grid array (BGA) package, the bump 41 is a solder ball. The package substrate 40 is electrically connected to the controller 100 with the bumps 41 disposed therebetween.

The interface chip (semiconductor chip) 20 is provided on a top surface of the package substrate 40.

The eight memory chips 30 (30a to 30h) are provided above the interface chip 20 and the package substrate 40. The eight memory chips 30a to 30h are sequentially layered from the bottom. Through silicon vias (TSV) 31 which arrive at the bottom surface from the top surface are formed in each of the memory chips 30a to 30g except for the topmost memory chip 30h. Bumps 32 for electrically connecting the TSVs 31 of the memory chips 30 are formed between two adjacent memory chips 30. The topmost memory chip 30h may include the TSVs 31.

A wiring 33 is formed on a bottom surface of the bottommost memory chip 30a. Bumps 21 are formed between the wiring 33 and the interface chip 20. Bumps 42 are formed between the wiring 33 and the package substrate 40.

Hereinafter, the configurations of the interface chip 20 and the memory chip 30 will be described.

Figure 3:
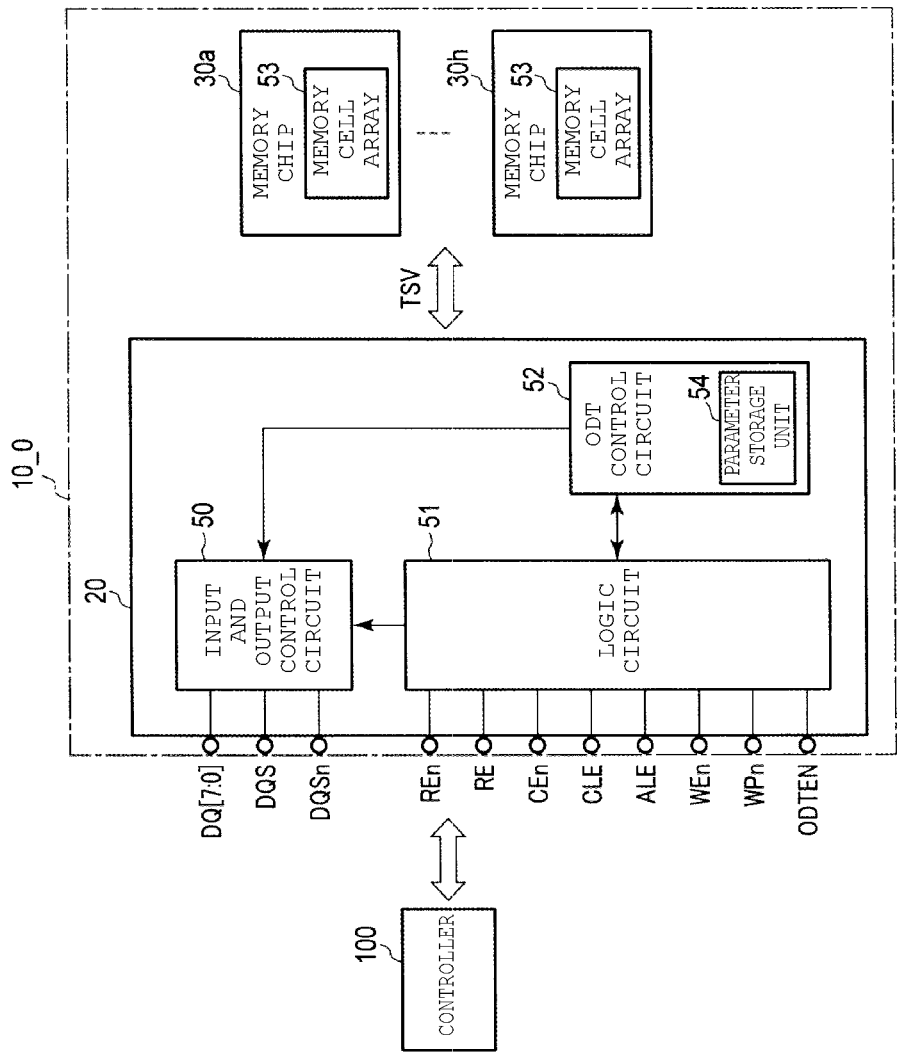
FIG. 3 is a block diagram of the nonvolatile semiconductor memory device according to the first embodiment.

As shown in FIG. 3, the interface chip 20 and each memory chip 30 are connected through the TSVs 31. Each memory chip 30 transmits and receives data to and from the controller 100 via the interface chip 20.

The memory chip 30 includes a memory cell array 53 which stores data. For example, the memory chip 30 may be a plane NAND flash memory including the memory cell array 53 in which memory cells are two-dimensionally arranged on the semiconductor substrate, or may a three-dimensional stacked NAND flash memory including the memory cell array 53 in which memory cells are three-dimensionally arranged on the semiconductor substrate.

For example, the configuration of the memory cell array 53 of the three-dimensional layered NAND flash memory is described in U.S. patent application Ser. No. 12/407,403 which is entitled "THREE DIMENSIONAL STACKED NONVOLATILE SEMICONDUCTOR MEMORY" and is filed on Mar. 19, 2009. The configuration of the memory cell array of the three-dimensional stacked NAND flash memory is described in U.S. patent application Ser. No. 12/406,524 which is entitled "THREE DIMENSIONAL STACKED NONVOLATILE SEMICONDUCTOR MEMORY" and is filed on Mar. 18, 2009, U.S. patent application Ser. No. 12/679,991 which is entitled "NON-VOLATILE SEMICONDUCTOR STORAGE DEVICE AND METHOD OF MANUFACTURING THE SAME" and is filed on Mar. 25, 2010, and U.S. patent application Ser. No. 12/532,030 which is entitled "SEMICONDUCTOR MEMORY AND METHOD FOR MANUFACTURING SAME" and is filed on Mar. 23, 2009. All of these patent applications are herein incorporated by reference in their entirety.

The interface chip 20 includes an input and output control circuit 50, a logic circuit 51, and an on-die termination (ODT) control circuit 52. In order to transmit and receive signals including data to and from the outside (controller 100), the interface chip 20 includes a plurality of terminals corresponding to 8-bit data line DQ[7:0], clock signals DQS and DQSn, read enable signals RE and REn, a chip enable signal CEn, a command latch enable signal CLE, an address latch enable signal ALE, a write enable signal WEn, a write protect signal WPn, and an ODT enable signal ODTEN.

The logic circuit 51 receives control signals, for example, the read enable signals RE and REn, the chip enable signal CEn, the command latch enable signal CLE, the address latch enable signal ALE, the write enable signal WEn, the write protect signal WPn, and the ODT enable signal ODTEN from the controller 100. The logic circuit 51 is connected to a plurality of terminals corresponding to the plurality of control signals. The logic circuit 51 includes a non-shown ODT circuit that is connected a terminal which receives the read enable signals RE and REn. The ODT circuit is a circuit that terminates signal reflection occurring between the outside (controller 100) and the memory in the input and output of the signal. The logic circuit 51 transmits the received signal to the ODT control circuit 52.

The chip enable signal CEn is a signal for enabling the memory 10, and is asserted at a low ("L") level. The command latch enable signal CLE is a signal indicating that an input and output signal I/O is a command, and is asserted at a high ("H") level. The address latch enable signal ALE is a signal indicating that the input and output signal I/O is an address, and is asserted at an "H" level. The write enable signal WEn is a signal for acquiring the received signal into the memory 10, and is asserted at an "L" level each time the command, address and data are received by the controller 100. Thus, each time the signal WEn is toggled, the signal is acquired into the memory 10. The read enable signals RE and REn are signals for allowing the controller 100 to read data from the memory 10. The read enable signal REn is an inverted signal of the signal RE. For example, the read enable signal REn is asserted at an "L" level. The write protect signal WPn is a signal for commanding the prohibition of a write operation, and is asserted at an "L" level. The ODT enable signal ODTEN is a signal which controls an ON/OFF state of the ODT circuit within the memory 10, and is asserted at an "H" level.

The input and output control circuit 50 is connected to terminals corresponding to the data line DQ[7:0] and the clock signals DQS and DQSn. The input and output control circuit 50 includes an ODT circuit (not shown in FIG. 3) that is connected to terminals corresponding to the data line DQ[7:0] and the clock signals DQS and DQSn. The input and output control circuit 50 controls the input and output of an 8-bit input and output data signal IO[7:0] and the clock signals DQS and DQSn transmitted and received between the controller 100 and the memory 10 through the data line DQ[7:0]. The input and output data signal IO[7:0] is an 8-bit data signal, and includes various commands, addresses, and data. The input and output data signal IO is not limited to the 8-bit signal, and may be arbitrarily set. The clock signals DQS and DQSn are signals used in the input and output of data, and the clock signal DQSn is an inverted signal of the clock signal DQS.

Hereinafter, various signals are transmitted and received through a signal line (hereinafter, referred to as a "common signal line") that connects the controller 100 and the memories 10 in common unless particularly limited.

In the present embodiment, the chip enable signal CEn, the command latch enable signal CLE, the address latch enable signal ALE, the write enable signal Wen, and the ODT enable signal ODTEN may be transmitted using the common signal line, or may be transmitted using signal lines (hereinafter, referred to as "individual signal lines") that individually connect the controller 100 and the memories 10.

The ODT control circuit 52 includes a parameter storage unit 54. The ODT control circuit 52 controls the ODT circuits included in the input and output circuit 50 and the logic circuit 51 based on the setting of the parameter stored in the parameter storage unit 54 and the ODT enable signal and other signals transmitted from the logic circuit 51.

The parameter storage unit 54 stores parameters regarding the ODT circuits. The ODT control circuit 52 may not include a memory region, or may retain the parameters in another memory region.

1.1.3 Configuration of ODT Circuit

Hereinafter, the configuration of the ODT circuit will be described with reference to FIGS. 4 and 5.

Initially, the ODT circuit included in the input and output control circuit 50 will be described.

Figure 4:
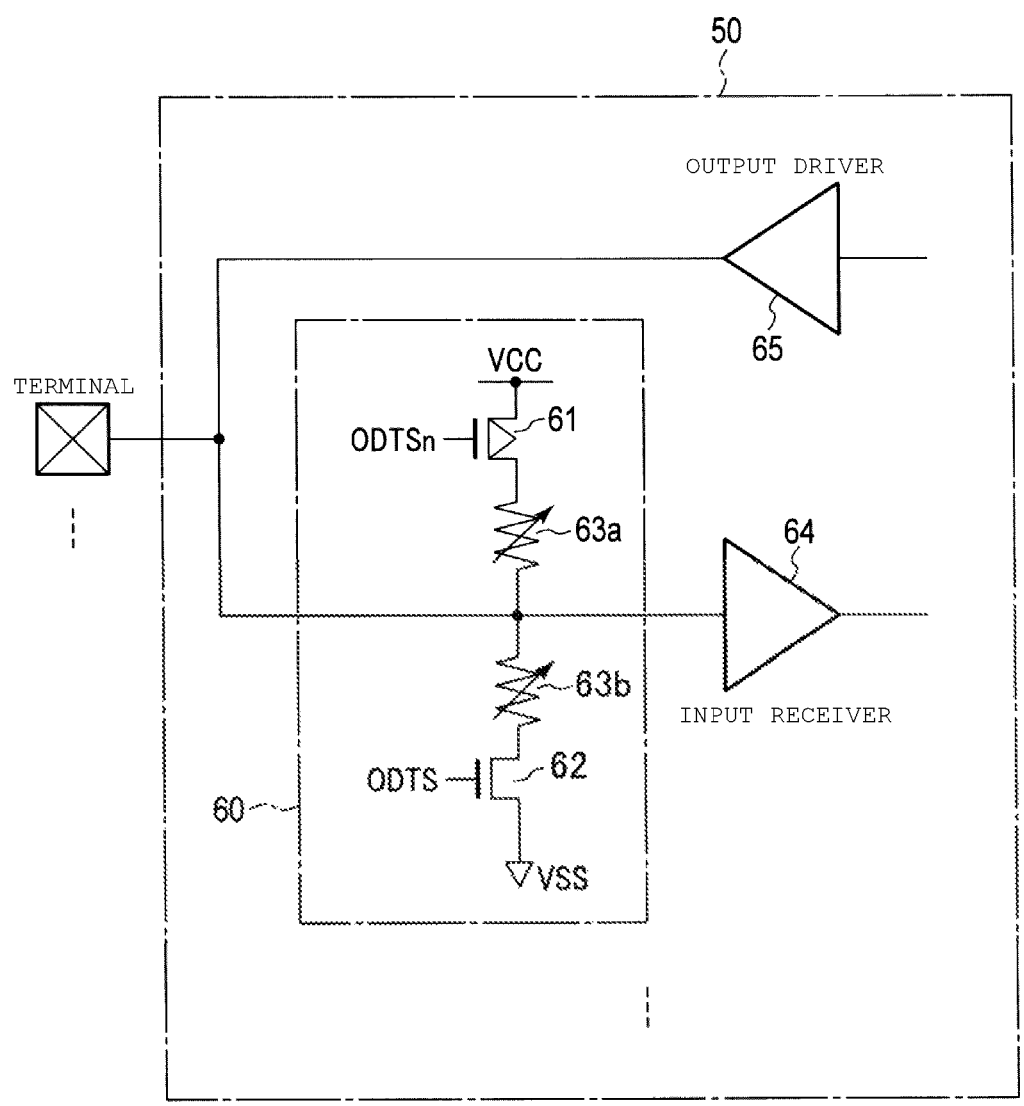
FIG. 4 is a schematic circuit diagram of an input and output terminal and an input and output control circuit of the nonvolatile semiconductor memory device according to the first embodiment.

As shown in FIG. 4, the input and output control circuit 50 includes an ODT circuit 60, an input receiver 64, and an output driver 65 for each corresponding terminal.

The input receiver 64 functions as, for example, a buffer, converts an input signal from the controller 100 into, for example, an appropriate voltage level for processing the signal within the memory 10, and transmits the converted signal to other circuits within the interface chip 20 and the memory chip 30.

The output driver 65 functions as, for example, a buffer, converts a signal transmitted from the memory chip 30 into an appropriate voltage level, and outputs the converted signal to the controller 100.

The ODT circuit 60 is provided between the terminal and the input receiver 64. The ODT circuit 60 includes a p-channel MOS transistor 61, an n-channel MOS transistor 62, and variable resistance elements 63*a* and 63*b*.

A signal ODTSn is input to a gate of the p-channel MOS transistor 61, a power supply voltage VCC is applied to a source thereof, and a drain thereof is connected to one end of the variable resistance element 63*a*. The p-channel MOS transistor 61 functions as a first switch element for connecting the variable resistance element 63*a* to a voltage line (power supply voltage line) to which the power supply voltage VCC is applied.

The other end of the variable resistance element 63*a* is connected to one end of the variable resistance element 63*b* and a wiring that connects the terminal and the input receiver 64. The ODT control circuit 52 sets resistance values of the variable resistance elements 63*a* and 63*b* according to a parameter written during a process of Set Feature (described below).

A signal ODTS is applied to a gate of the n-channel MOS transistor 62, a drain thereof is connected to the other end of the variable resistance element 63*b*, and a ground voltage VSS is applied to a source thereof. The n-channel MOS transistor 62 functions as a second switch element for connecting the variable resistance element 63*b* to a voltage line (ground voltage line) to which the ground voltage VSS is applied.

The signal ODTS and the signal ODTSn are signals applied from the ODT control circuit 52 in order to control the ODT circuit 60. The signal ODTSn is an inverted signal of the signal ODTS. When the ODT circuit 60 is turned on, the ODT control circuit 52 sets the signal ODTS to an "H" level, and sets the signal ODTSn to an "L" level.

Hereinafter, the ODT circuit 60 included in the logic circuit 51 will be described.

Figure 5:
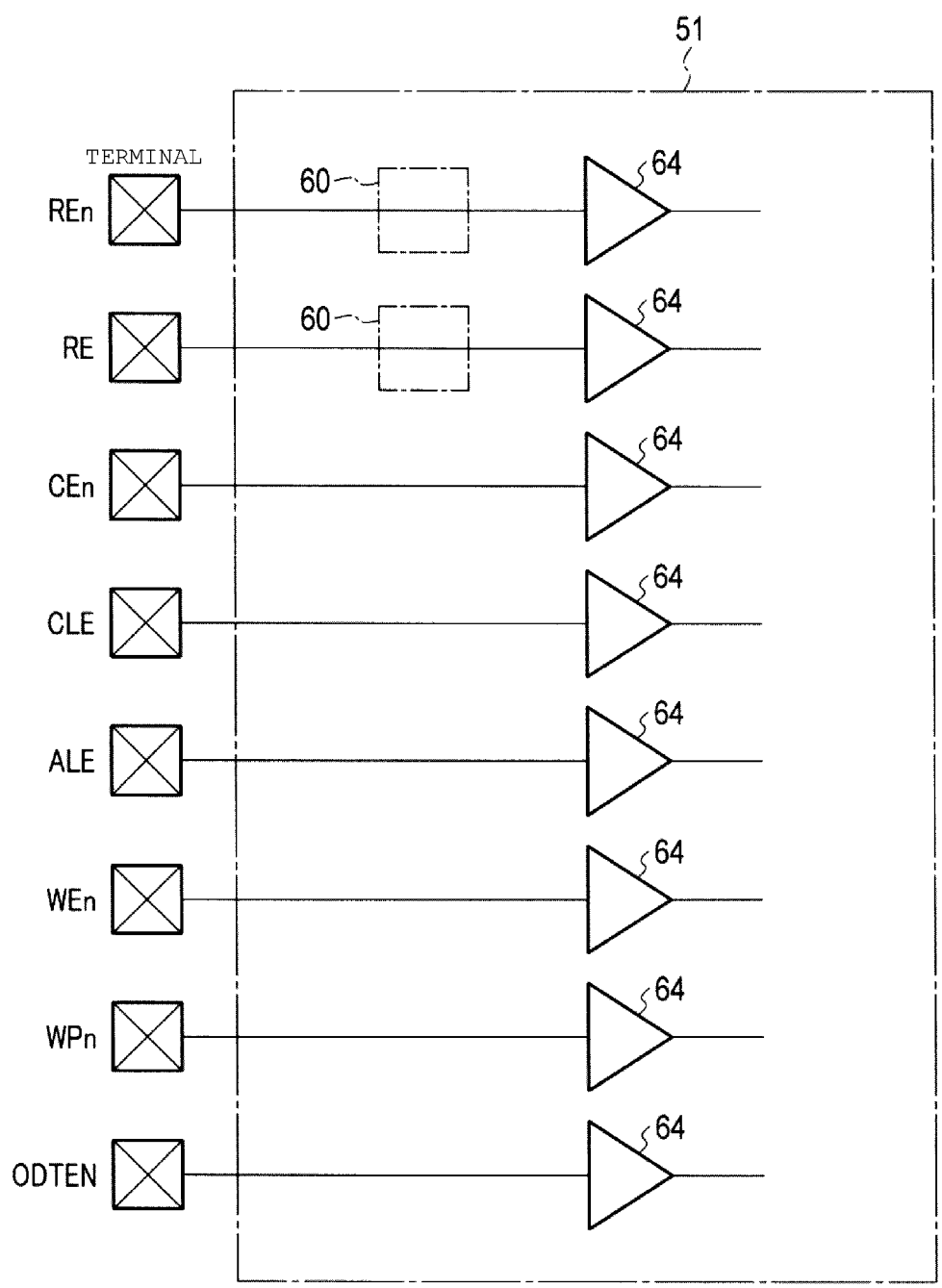
FIG. 5 is a schematic circuit diagram showing a connection of the input and output terminal with a logic circuit of the nonvolatile semiconductor memory device according to the first embodiment.

As shown in FIG. 5, the logic circuit 51 includes an input receiver 64 for each corresponding terminal (reference numeral "PAD" of FIG. 5). The ODT circuit 60 is provided between the input receiver 64 and the terminals corresponding to the read enable signals REn and RE.

The ODT circuit 60 connected to the terminals corresponding to the read enable signals REn and RE may not be provided, or the ODT circuit 60 connected to other terminals may be provided. The ODT circuit may be arbitrarily set.

1.2 Operation of ODT Circuit

Hereinafter, the operation of the ODT circuit 60 will be described. The ODT control circuit 52 has two control modes called a "DIN mode" and a "DOUT mode". The ODT control circuit 52 selects one or more ODT circuits 60 to be turned on depending on the control modes. The DIN mode is a mode selected when the controller 100 outputs the data and a write operation is performed in a memory 10. Meanwhile, the DOUT mode is a mode selected when a read operation is performed in a memory 10 and the memory 10 outputs data. Hereinafter, in the present embodiment, a case where the ODT circuit 60 corresponding to the data line DQ[7:0] and the clock signals DQS and DQSn is turned on in the DIN mode and the ODT circuit 60 corresponding to the data line DQ[7:0], the clock signals DQS and DQSn and the read enable signals REn and RE is turned on in the DOUT mode will be described.

1.2.1 Control Flow of ODT Circuit

Initially, the control flow of the ODT circuit 60 will be described with reference to FIG. 6.

Figures 6, 7:
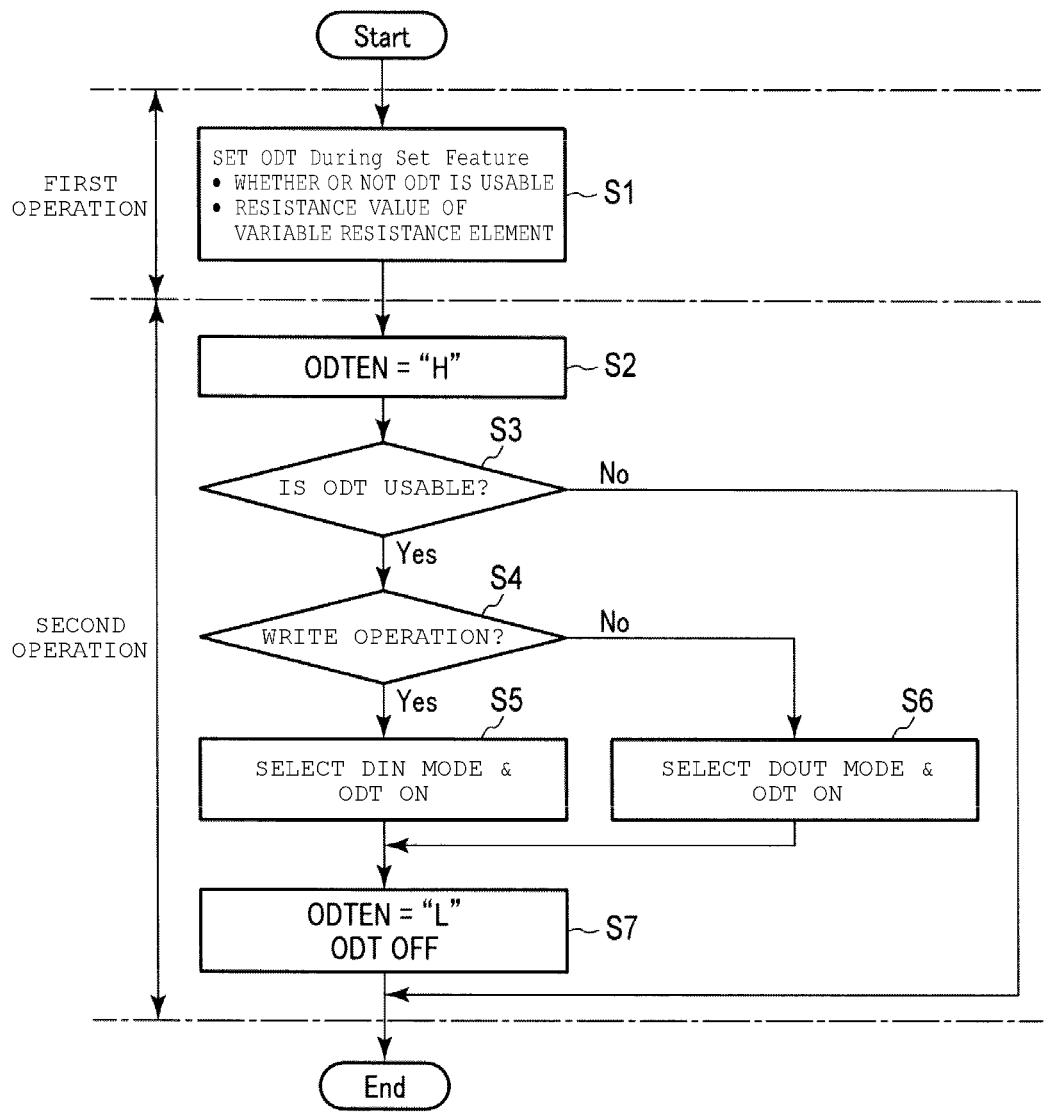
FIG. 6 is a flowchart showing an operation of an ODT circuit of a memory system according to the first embodiment.
FIG. 7 illustrates a relationship between a control mode of the ODT circuit and logic states of various control signals in the memory system according to the first embodiment.

As shown in FIG. 6, as the control of the ODT circuit 60, there are broadly two operations. In the first operation, the controller 100 sets the parameter of the ODT circuit 60 (step S1). Hereinafter, the write operation of the parameter is referred to as "Set Feature". During the Set Feature, various parameters other than the parameter of the ODT circuit 60 are written.

More specifically, for example, after power is supplied, the controller 100 performs the Set Feature and sets various parameters during a first operation. In this case, the controller 100 determines setting of whether or not to use the ODT circuit 60 in the interface chip 20 of the memory 10. For example, the controller 100 determines setting such that only the interface chip 20 of the memory 10 that is connected through the longest signal line (NAND bus) to the controller 100 uses the ODT circuit 60 and the interface chip 20 of the other memory 10 does not use the ODT circuit 60. The controller 100 sets the resistance values of the variable resistance elements 63a and 63b in the DIN mode and the DOUT mode to the interface chip 20 that can use the ODT circuit 60. The ODT control circuit 52 of the interface chip 20 retains setting of whether or not to use the ODT circuit 60 and parameter information regarding the resistance values of the variable resistance elements 63a and 63b in the parameter storage unit 54.

Subsequently, the controller 100 transmits the ODT enable signal ODTEN in a second operation. The ODT control circuit 52 of the interface chip 20 of the memory 10 controls the ON/OFF of the ODT circuit 60 depending on the parameter information set in the first operation and the ODT enable signal ODTEN.

More specifically, initially, the controller 100 sets the ODT enable signal ODTEN to an "H" level, and transmits the signal to the memory 10 (step S2).

When the ODT circuit 60 is usable in step S1 (step S3 Yes), the ODT control circuit 52 of the memory 10 which receives the ODT enable signal selects the control mode of the ODT circuit 60. Meanwhile, when the ODT circuit 60 is not usable (Step S3_No), the control operations of the ODT circuit 60 subsequent to step S3 are omitted.

When the write operation is performed in any one of the memories 10 (step S4_Yes), the ODT control circuit 52 selects the DIN mode.

Subsequently, the ODT control circuit 52 turns on the ODT circuit 60 corresponding to the data line DQ[7:0] and the clock signals DQS and DQSn (step S5). More specifically, the ODT control circuit 52 sets the signal ODTS of the corresponding ODT circuit 60 to an "H" level, and sets the signal ODTSn to an "L" level. Thus, the transistors 61 and 62 are turned on, and the ODT circuit 60 is turned on.

Meanwhile, when the write operation is not performed in any one of the memories 10, that is, when the read operation is performed, the ODT control circuit 52 selects the DOUT mode, and turns on the ODT circuit 60 corresponding to the data line DQ[7:0], the clock signals DQS and DQSn and the read enable signals REn and RE (step S6).

Subsequently, the controller 100 sets the ODT enable signal ODTEN to an "L" level. Accordingly, the ODT control circuit 52 turns off the ODT circuit 60 (step S7).

When it is not necessary to change the parameter, the controller 100 controls the ODT circuit 60 by repeatedly performing the second operation according to the write and read operations.

1.2.2 Control Mode Selection of ODT Circuit

Hereinafter, the control mode selection of the ODT circuit 60 will be described with reference to FIG. 7.

As shown in FIG. 7, the memory 10 (ODT control circuit 52) latches the read enable signal REn at a timing when the ODT enable signal ODTEN is switched from the "L" level to the "H" level. When the read enable signal REn is at the "H" level, the memory 10 selects the DIN mode, and turns on the corresponding ODT circuit 60. Meanwhile, when the read enable signal REn is at the "L" level, the memory 10 selects the DOUT mode, and turns on the corresponding ODT circuit 60. That is, in the write operation, the controller 100 sets the read enable signal REn to an "H" level, and switches the ODT enable signal ODTEN from an "L" level to an "H" level. In the read operation, the controller sets the read enable signal REn to an "L" level, and switches the ODT enable signal ODTEN from an "L" level to an "H" level.

The memory 10 turns off the ODT circuit 60 for a period during which the ODT enable signal ODTEN is at an "L" level.

1.2.3 Set Feature

Hereinafter, transmission and reception of signals between the controller 100 and the memory 10 during the Set Feature will be described with reference to FIG. 8.

Figure 8:
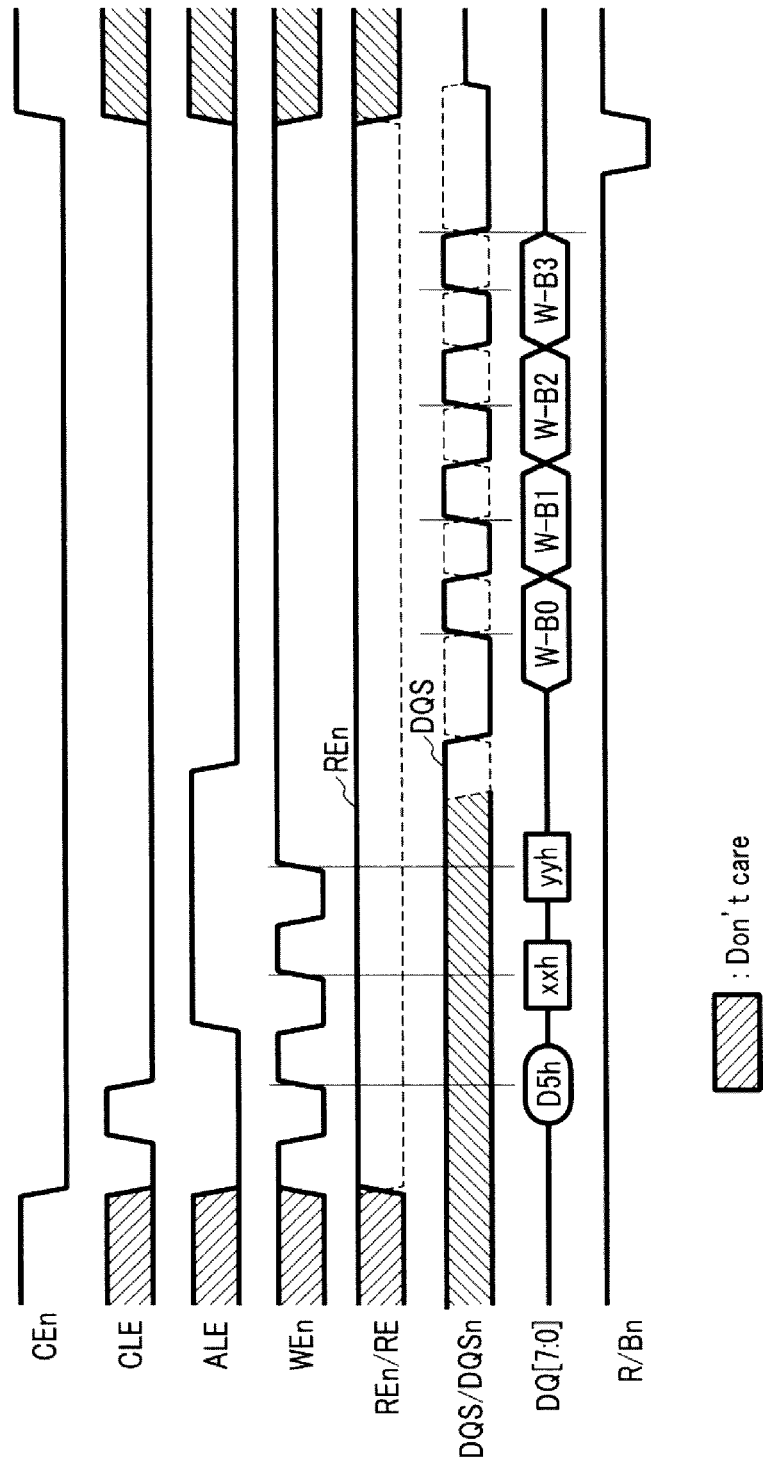
FIG. 8 is a timing chart of signals during Set Feature carried out in the memory system according to the first embodiment.

As shown in FIG. 8, the controller 100 initially asserts the chip enable signal CEn (to an "L" level).

Subsequently, the controller 100 issues a command, for example, "D5h" for notifying that the Set Feature is performed, and asserts the command latch enable signal CLE (to an "H" level).

Subsequently, the controller 100 issues address data items "xxh" and "yyh", and asserts the address latch enable signal ALE (to an "H" level). For example, the address data "xxh" is address data regarding the setting of the Set Feature, and the address data "yyh" is address data indicating the corresponding memory 10. The details of the address data and the number of cycles are not particularly limited.

These commands and addresses are respectively stored in the corresponding memories 10 each time the write enable signal WEn is toggled.

Subsequently, the controller 100 transmits the clock signals DQS and DQSn, and issues data "W-B0" to "W-B3". For example, the data "W-B0" indicate data regarding whether or not the ODT circuit 60 is usable and the setting of the variable resistance elements 63a and 63b, and the data "W-B1" to "W-B3" indicate data regarding other parameters. The number of cycles of the data may be arbitrarily set depending on a parameter required to be set.

The memory 10 starts to write the parameter, and turns into a busy state. The memory 10 sets a ready/busy signal R/Bn for notifying that various signals are not received during the busy state to an "L" level, and transmits the signal to the controller 100.

When the memory 10 completes the write operation, the ready/busy signal R/Bn is returned to an "H" level.

1.2.4 Control of ODT Circuit in Write Operation

Figure 9:
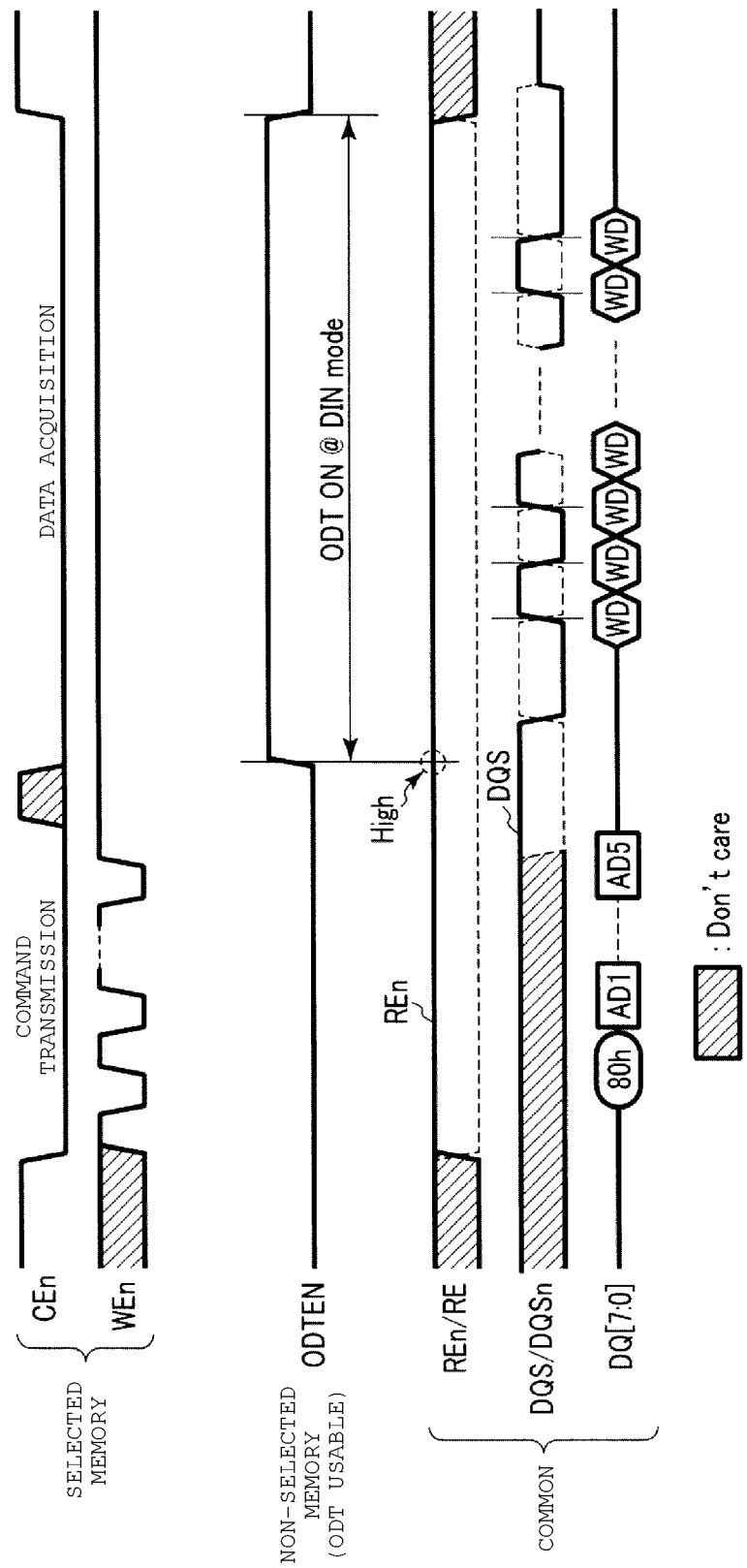
FIG. 9 is a timing chart of signals during a write operation carried out in the memory system according to the first embodiment.

Hereinafter, the transmission and reception of the signal between the controller 100 and the memory 10 in the write operation will be described with reference to FIG. 9 by especially focusing on the control of the ODT circuit 60 in the non-selected memory 10. In FIG. 9, the command latch enable signal CLE and the address latch enable signal ALE are omitted.

As shown in FIG. 9, the controller 100 initially asserts the chip enable signal CEn (to an "L" level). The controller 100 maintains the read enable signal REn at an "H" level in the write operation.

Subsequently, the controller 100 issues a command, for example, "80h" for notifying that the write operation is performed, and address data items "AD1", "AD2", "AD3", "AD4" and "AD5". For example, the address data items "AD1" and "AD2" indicate column addresses of the memory chip 30, and the address data items "AD3", "AD4" and "AD5" indicate row addresses. In the selected memory 10, the command and the address data are retained within the memory 10 each time the write enable signal WEn is toggled.

The number of cycles of the address data is not limited to five cycles, and may be arbitrarily set. The address data may include an address for designating the memory 10, and a chip address (CADD) for designating the memory chip 30 within the memory 10. The row address may include a block address, and a page address. The page address may include, for example, word lines WL, odd/even-numbered bit lines (E/O), string addresses, or information regarding lower page/intermediate page/upper page (L/M/U).

The configuration of the page address is described in U.S. patent application Ser. No. 13/784,753 which is titled "NONVOLATILE SEMICONDUCTOR MEMORY DEVICE AND CONTROL METHOD THEREOF" and is filed on Mar. 4, 2013. The present patent application is herein incorporated by reference in its entirety.

Subsequently, the controller 100 sets the ODT enable signal ODTEN to an "H" level. In this case, in the non-selected memory 10 in which the ODT circuit 60 is usable, that is, to which the parameter of the ODT circuit 60 in the first operation (Set Feature) is set, since the read enable signal REn is at an "H" level, the ODT control circuit 52 selects the DIN mode, and turns on the corresponding ODT circuit 60. Meanwhile, in the non-selected memory 10 which does not use the ODT circuit 60, that is, to which the parameter of the ODT circuit 60 is not set in the first operation (Set Feature), the ODT control circuit 52 does not turn on the ODT circuit 60 irrespective of the ODT enable signal ODTEN.

Subsequently, the controller 100 transmits the clock signals DQS and DQSn, and issues the write data "WD".

When the write operation in the selected memory 10 is completed, the controller 100 sets the chip enable signal CEn to an "H" level, and sets the ODT enable signal ODTEN to an "L" level. When the ODT enable signal ODTEN is at an "L" level, the non-selected memory 10 in which the ODT circuit 60 is usable turns off the ODT circuit 60.

1.2.5 Control of ODT Circuit in Read Operation

Figure 10:
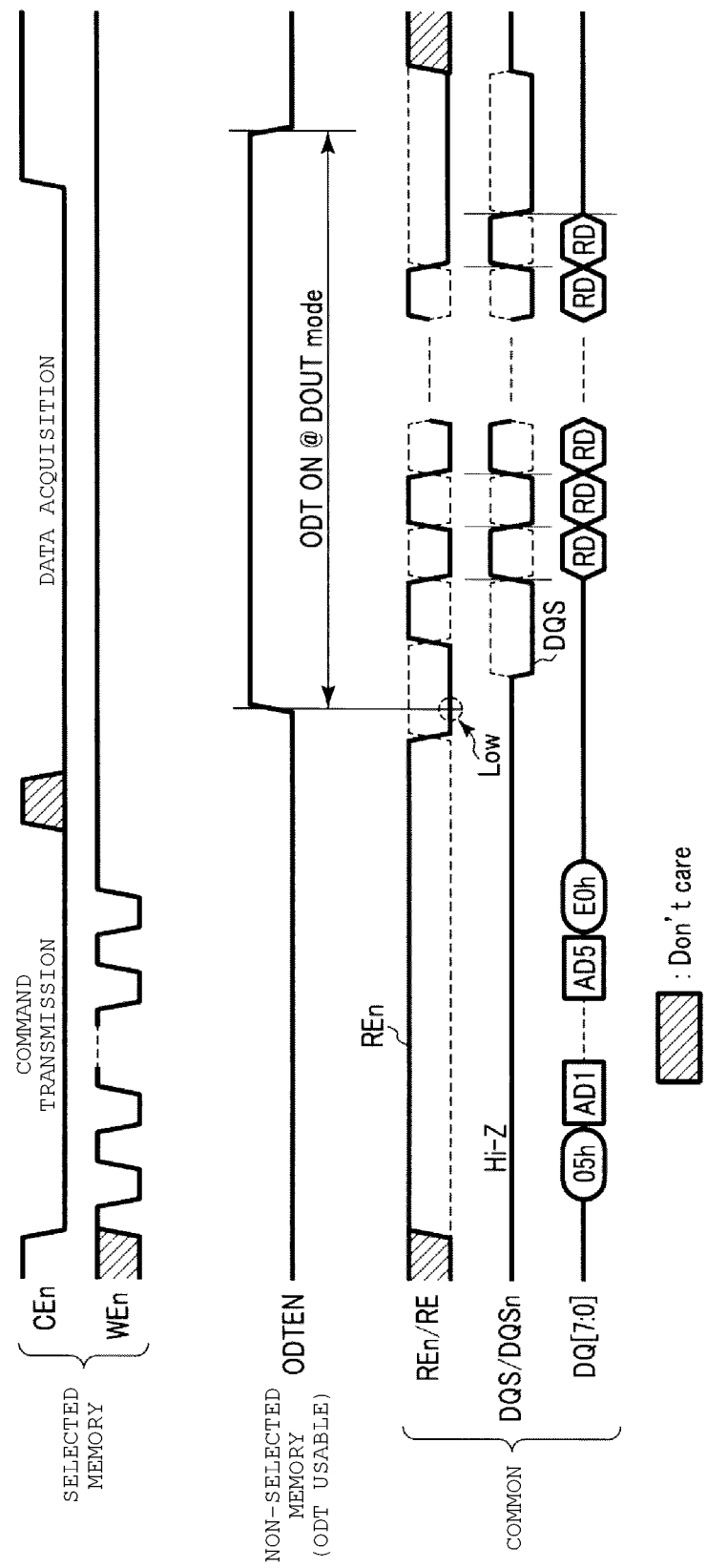
FIG. 10 is a timing chart of signals during a read operation carried out in the memory system according to the first embodiment.

Hereinafter, transmission and reception of signals between the controller 100 and the memory 10 in the read operation will be described with reference to FIG. 10 by especially focusing on the control of the ODT circuit 60 in the non-selected memory 10. In FIG. 10, the command latch enable signal CLE and the address latch enable signal ALE are omitted.

As shown in FIG. 10, the controller 100 asserts the chip enable signal CEn (to an "L" level).

Subsequently, the controller 100 sequentially issues a command, for example, "05h" for notifying that the read operation is performed, address items "AD1" to "AD5", and a command, for example, "E0h" for performing the read operation. In the selected memory 10, the command and the address data are retained within the memory 10 each time the write enable signal WEn is toggled.

Subsequently, the controller 100 sets the read enable signal REn to an "L" level during a certain period. The controller 100 sets the ODT enable signal ODTEN from an "L" level to an "H" level within this period. In this case, in the non-selected memory 10 that is usable by the ODT circuit 60, since the read enable signal REn is at an "L" level, the ODT control circuit 52 selects the DOUT mode, and turns on the corresponding ODT circuit 60. Meanwhile, in the non-selected memory 10 that does not use the ODT circuit 60, the ODT control circuit 52 does not turn on the ODT circuit 60 irrespective of the ODT enable signal ODTEN.

Subsequently, the read operation is performed in the selected memory 10, and the read data "RD" and the clock signals DQS and DQSn are output according to the toggle of the read enable signals REn and RE.

When the read operation of the selected memory 10 is completed, the controller 100 sets the chip enable signal CEn to an "H" level, and sets the ODT enable signal ODTEN to an "L" level. When the ODT enable signal ODTEN is at an "L" level, the non-selected memory 10 in which the ODT circuit 60 is usable turns off the ODT circuit 60.

1.2.6 Operation Timing of ODT Circuit

Hereinafter, an ON/OFF switching timing of the ODT circuit 60 and the ODT enable signal ODTEN will be described with reference to FIG. 11.

Figure 11:
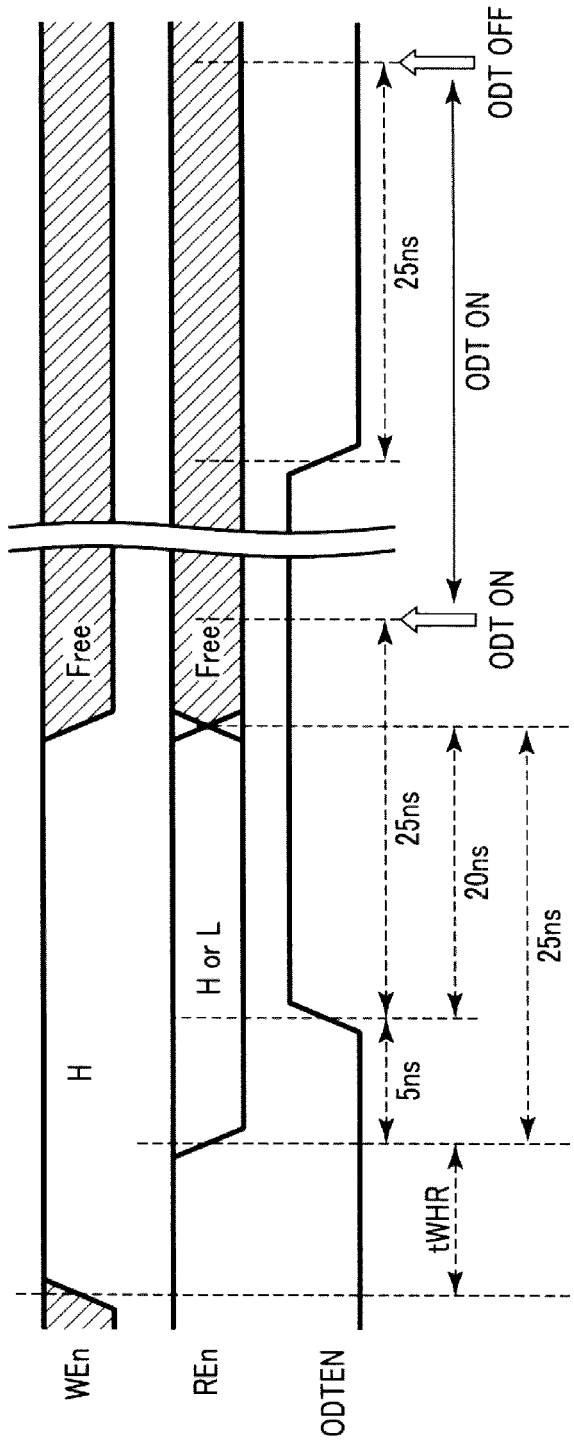
FIG. 11 is a timing chart showing a relationship between control signals and an operation timing of the ODT circuit in the memory system according to the first embodiment.

As shown in FIG. 11, the memory 10 is set so as not to receive various signals including the read enable signal REn during a predetermined period after the write enable signal WEn is switched from an "L" level to an "H" level. Alternatively, the controller 100 may be set so as not to voluntarily issue various signals during this period. Hereinafter, the predetermined period, that is, a waiting period from a time at which the write enable signal WEn is switched from an "L" level to an "H" level until the read enable signal REn can be received is referred to as "tWHR". For example, after the address data "AD5" is input in the write operation (FIG. 9) and after the command "E0h" is input in the read operation (FIG. 10), the waiting period tWHR is present.

After the waiting period tWHR elapses, the memory 10 receives the read enable signal REn (the read enable signal REn becomes valid). During a period until 25 nsec or longer elapses after the waiting period tWHR ends, the controller 100 maintains the read enable signal REn at an "H" level in the write operation, and maintains the read enable signal at an "L" level in the read operation (hereinafter, referred to as a "REn maintaining period"). The controller 100 switches the ODT enable signal ODTEN from an "L" level to an "H" level in a period (for example, 20 nsec) from a time at which 5 nsec or longer elapses since the starting (that is, the ending of the waiting period tWHR) of the REn maintaining period until the REn maintaining period ends. That is, if 5 nsec or longer elapses since the starting of the REn maintaining period, the controller 100 can switch the ODT enable signal ODTEN in non-synchronization with other signals.

At a timing when the ODT enable signal ODTEN is switched from an "L" level to an "H" level, the ODT control circuit 52 latches the read enable signal REn, and selects the control mode of the ODT circuit 60. For example, the ODT control circuit 52 turns on the corresponding ODT circuit 60 after 25 nsec elapses from the switching the ODT enable signal ODTEN from an "L" level to an "H" level. For example, the ODT control circuit 52 turns off the corresponding ODT circuit 60 after 25 nsec elapses from the switching of the ODT enable signal ODTEN from an "H" level to an "L" level.

1.3 Advantage of Present Embodiment

According to the present embodiment, it is possible to improve processing capability. Hereinafter, advantage of the present embodiment will be described.

In the memory system 1 in which the controller 100 and the plurality of memories 10 are connected in common through the bus, reflection of a signal from the non-selected memory 10 is transferred to the selected memory 10 or the controller 100 which is an input destination of the signal, the reflected signal becomes a noise of the input signal. For such an issue, there is a method of suppressing the reflection of the signal using the ODT circuit 60.

For example, there is a method of respective transmitting commands (and address data items) for notifying the non-selected memory 10 that the use of the ODT circuit 60 is started and is ended before and after the write or read operation when the ON/OFF operation of the ODT circuit 60 is controlled in the non-selected memory 10. However, in this case, since it is necessary to notify the non-selected memory 10 irrespective of the write or read operation, processing times in the write and read operations become longer, and thus, the processing capability of the memory system 1 is degraded.

The state of the signal transmitted and received between the controller 100 and the selected memory 10 is different between the write operation and the read operation. More specifically, for example, the data are read according to the toggle of the read enable signal REn in the read operation, whereas the read enable signal REn is maintained at an "H" level in the write operation. Accordingly, it is preferable that the ODT circuit 60 corresponding to the read enable signal REn is used in the read operation and is not used in the write operation. As stated above, it is necessary to control the ON/OFF of the ODT circuit 60 depending on the operation state of the memory system.

In contrast, in the configuration according to the present embodiment, the controller 100 can issue the signal (ODT enable signal ODTEN) for controlling the ODT circuit 60. The controller 100 can transmit the ODT enable signal ODTEN to the memories 10 during the write and read operations. The memory 10 can control the ODT circuit 60 according to the ODT enable signal ODTEN. Thus, the controller 100 can omit the notification performed by the ODT circuit 60 to the non-selected memory 10 before and after the write or read operations. Accordingly, it is possible to reduce the processing times of the write and read operations, and thus, it is possible to the processing capability of the memory system.

According to the present embodiment, it is possible to switch the control mode of the ODT according to the read enable signal REn. More specifically, when the ODT enable signal ODTEN is switched from an "L" level to an "H" level, the memory 10 selects the DIN mode if the read enable signal REn is at an "H" level, and selects the DOUT mode if the read enable signal is at an "L" level. Thus, the memory 10 can select the control state of the optimum ODT circuit 60 in the write and read operations. Accordingly, it is possible to effectively the noise due to the reflection of the signal, and thus, it is possible to the quality of the signal. Therefore, it is possible to suppress a malfunction due to the degradation of the signal, and thus, it is possible to improve the reliability of the memory system.

2. Second Embodiment

Hereinafter, a second embodiment will be described. A difference from the first embodiment is that the configuration of the memory 10 is different and each memory chip includes the ODT circuit. Only a difference from the first embodiment will be described below.

2.1 Configuration of Memory

The configuration of the memory 10 according to the present embodiment will be described with reference to FIGS. 12 and 13. In the following description, the memory 10_0 will be described, but the other memories 10 (10_1, 10_2, . . . ) have the same configuration.

Initially, the sectional configuration of the memory 10 will be described.

Figure 12:
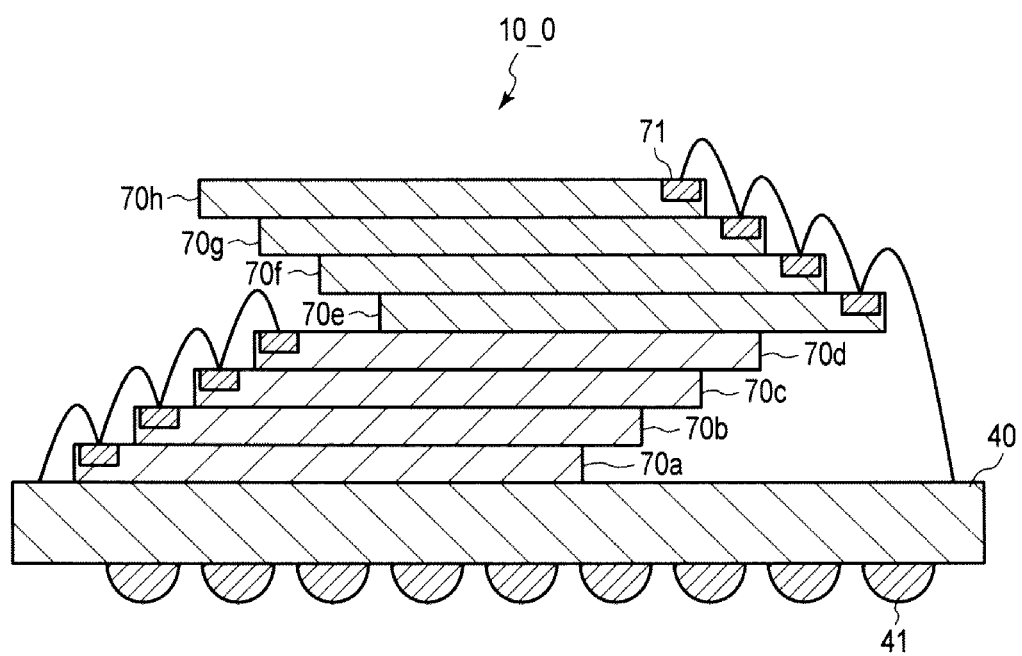
FIG. 12 is a cross-sectional view of a nonvolatile semiconductor memory device according to a second embodiment.

As shown in FIG. 12, the memory 10_0 includes a package substrate 40 and eight memory chips 70 (70a to 70h). For example, the plurality of memory chips 70 is sealed on the package substrate 40 by a mold resin (not shown). In the memory 10_0 according to the present embodiment, the interface chip 20 described in FIGS. 2 and 3 of the first embodiment is not used.

Similarly to the memory chip 30 described in FIGS. 2 and 3 of the first embodiment, the memory chip 70 stores data from the controller 100. The eight memory chips 70 (70a to 70h) are layered, but the number of memory chips 70 is not limited to eight. The number of memory chips may be arbitrarily changed. Each memory chip 70 includes a plurality of terminals 71 for transmitting and receiving signals to and from the outside (controller 100) on top surfaces of the memory chips 70.

The memory chips 70a to 70h are sequentially layered on the top surface of the package substrate 40 in a state in which the terminals 71 are exposed, for example, the centers of the memory chips are offset. The terminals 71 of the memory chips 70 are electrically connected to the package substrate 40 through, for example, metal wirings.

Hereinafter, the configuration of the memory chip 70 will be described. In the following description, the memory chip 70a will be described, but the other memory chips 70b to 70h have the same configuration.

Figures 13, 14:
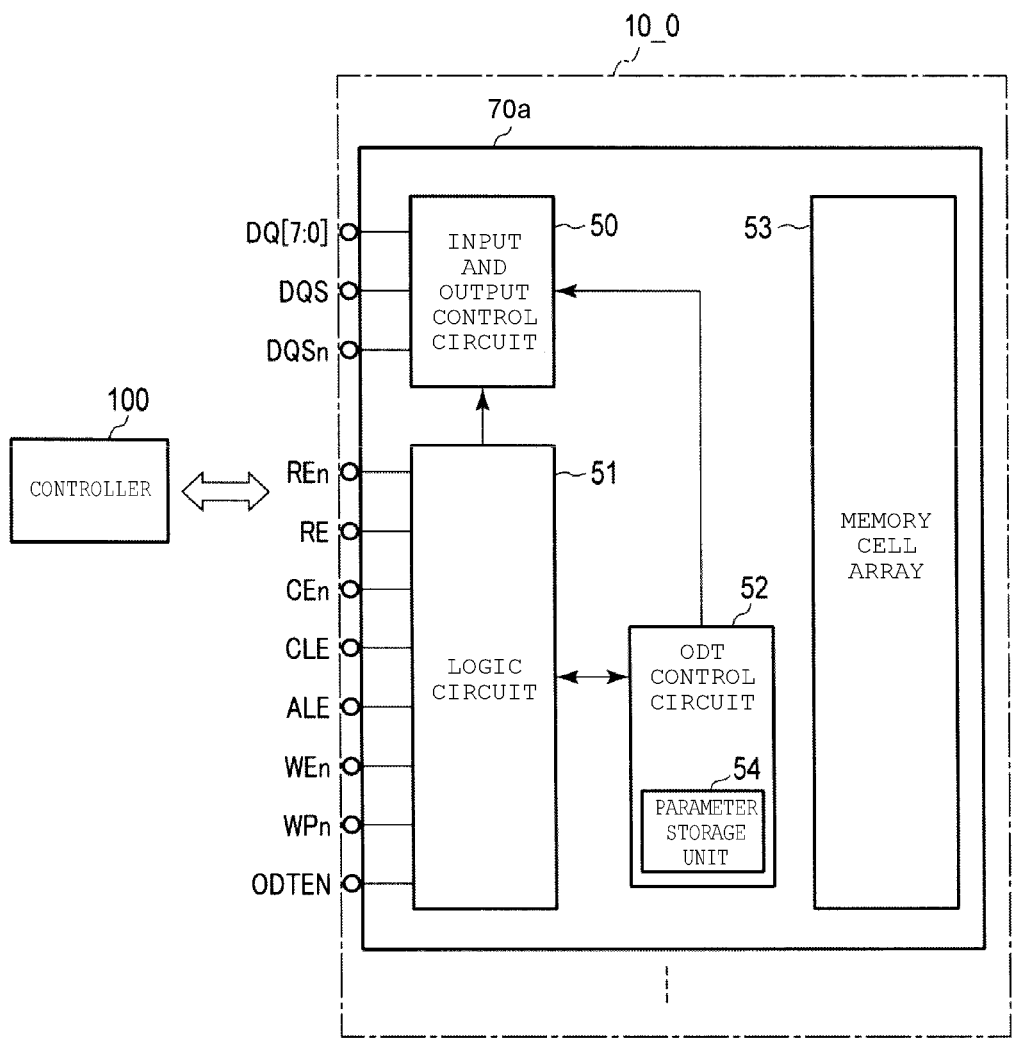
FIG. 13 is a block diagram of a memory chip of the nonvolatile semiconductor memory device according to the second embodiment.
FIG. 14 illustrates a relationship between a control mode of an ODT circuit and logic states of control signals in a memory system according to a third embodiment.

As shown in FIG. 13, the memory chip 70a includes an input and output control circuit 50, a logic circuit 51 and an ODT control circuit 52 included in the interface chip 20 described in FIG. 3 of the first embodiment, and a memory cell array 53 included in the memory chip 30. The memory chip 70a includes terminals which respectively correspond to read enable signals RE and REn, a chip enable signal CEn, a command latch enable signal CLE, an address latch enable signal ALE, a write enable signal WEn, a write protect signal WPn, and an ODT enable signal ODTEN. Similarly to the first embodiment, the input and output control circuit 50 of the memory chip 70a includes an ODT circuit 60 connected to terminals corresponding to data line DQ[7:0] and clock signals DQS and DQSn, and the logic circuit includes an ODT circuit 60 connected to terminals corresponding to read enable signals REn and RE.

2.2 Operation of ODT Circuit

Hereinafter, the operation of the ODT circuit 60 included in the memory chip 70 will be described. The control flow of the ODT circuit 60 is the same as that of the first embodiment shown in FIG. 6. Here, when the Set Feature is performed during the first operation, the controller 100 sets a parameter regarding the ODT circuit 60 for each memory 10 (interface chip 20) in the first embodiment, whereas the controller sets the parameter regarding the ODT circuit 60 for each memory chip 70 in the present embodiment. In the second operation, the ODT control circuit 52 of each memory chip 70 controls the operation of the ODT circuit 60 according to the signal transmitted to and received from the controller 100.

2.3 Advantage of Present Embodiment

In the configuration according to the present embodiment, it is possible to obtain the same advantage as that of the first embodiment.

In the configuration according to the present embodiment, since each memory chip 70 includes the ODT circuit 60, whether or not the ODT circuit 60 is operated may be set with respect to each memory chip 70. Thus, the memory system 1 can perform the more detailed setting for suppressing the reflected signal. Accordingly, it is possible to more effectively reduce the noise due to the reflection signal, and thus, it is possible to improve the quality of the signal.

3. Third Embodiment

Hereinafter, a third embodiment will be described. A difference from the first and second embodiments is that the chip enable signal CEn is also used in the determination when the control mode of the ODT circuit 60 is determined. Only a difference from the first and second embodiments will be described below.

3.1 Entire Configuration of Memory System

Initially, the entire configuration of the memory system 1 will be described. In the memory system 1 according to the present embodiment, for the chip enable signals CEn, the controller 100 and the memories 10 (10_0, 10_1, 10_2, . . . ) are connected through individual signal lines. That is, the controller 100 can respectively transmit different chip enable signals CEn to the memories 10 by using the individual signal lines. Hereinafter, the chip enable signals are referred to as chip enable signals "CEnx" when the controller 100 transmits the chip enable signal CEn by using the individual signals, that is, when the chip enable signal indicate the plurality of chip enable signals CEn.

The command latch enable signal CLE, the address latch enable signal ALE, the write enable signal Wen, and the ODT enable signal ODTEN may be transmitted using a common signal line, or may be transmitted using individual signal lines.

3.2 Control Mode Selection of ODT Circuit

Initially, the selection of the control mode of the ODT circuit 60 will be described with reference to FIG. 14.

As shown in FIG. 14, in the present embodiment, the ODT control circuit 52 latches the chip enable signal CEnx and the read enable signal REn at a timing when the ODT enable signal ODTEN is switched from an "L" level to an "H" level. When the chip enable signal CEnx and the read enable signal REn are at an "H" level, the ODT control circuit 52 selects the DIN mode, and turns on the corresponding ODT circuit 60. When the chip enable signal CEnx is at an "H" level and the read enable signal REn is at an "L" level, the ODT control circuit 52 selects the DOUT mode, and turns on the corresponding ODT circuit 60. When the chip enable signal CEnx is at an "L" level, the ODT control circuit 52 turns off the ODT circuit 60 irrespective of the read enable signal REn.

For a period during which the ODT enable signal ODTEN is at an "L" level, the ODT control circuit 52 turns off the ODT circuit 60.

3.3 Control of ODT Circuit in Write Operation

Hereinafter, transmission and reception of signals between the controller 100 and the memory 10 in the write operation will be described with reference to FIG. 15.

Figure 15:
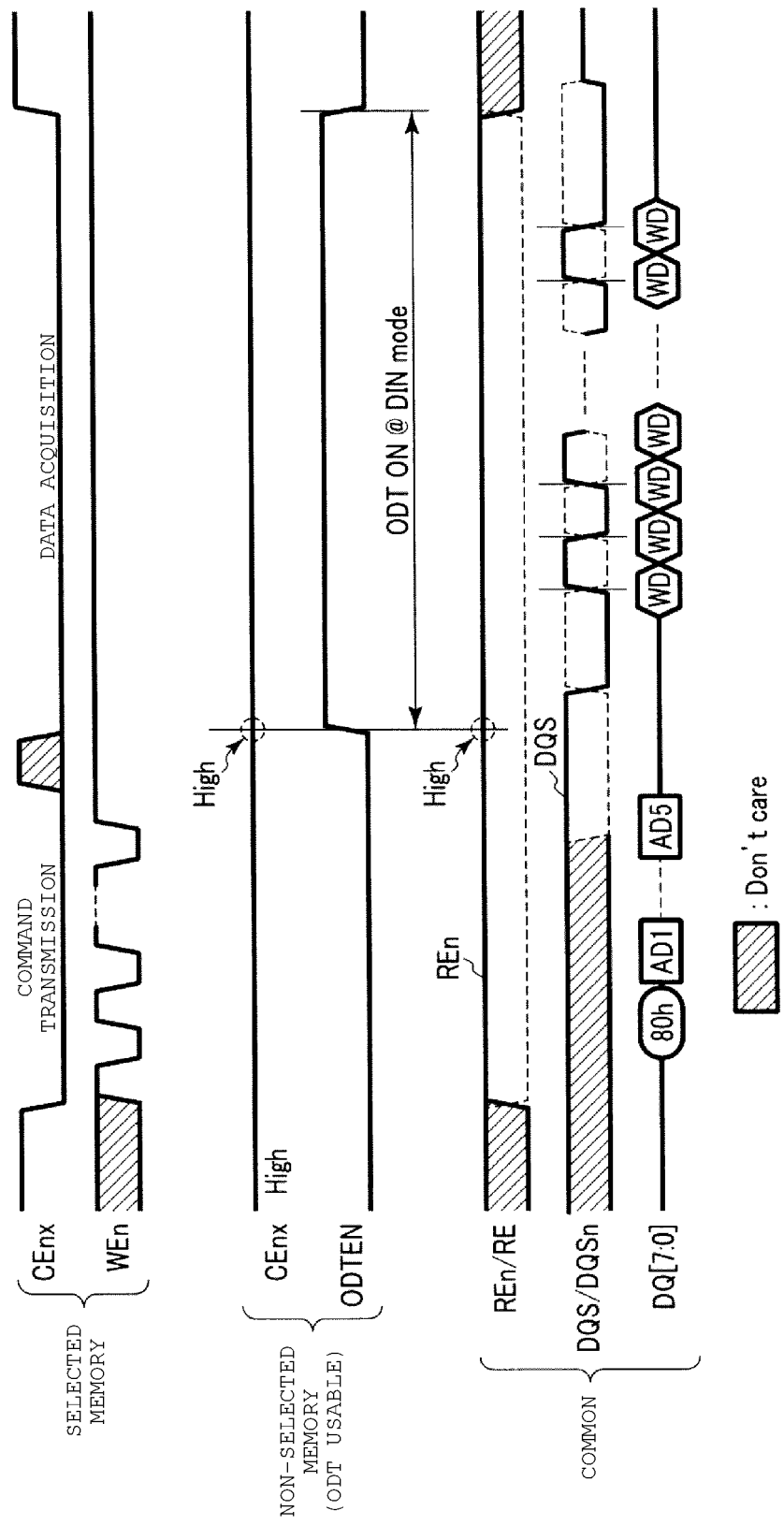
FIG. 15 is a timing chart of signals during a write operation carried out in the memory system according to the third embodiment.

As shown in FIG. 15, initially, the controller 100 asserts the chip enable signal CEnx of the selected memory 10 (to an "L" level). The controller 100 maintains the non-selected memory 10 at an "H" level during the write operation of the chip enable signal CEnx.

Subsequently, the controller 100 issues the command and address data for the write operation, and sets the ODT enable signal ODTEN to an "H" level. In this case, in the non-selected memory 10 in which the ODT circuit 60 is usable, since the chip enable signal CEnx and the read enable signal REn are at an "H" level, the ODT control circuit 52 selects the DIN mode, and turns the corresponding to the ODT circuit 60.

When the write operation of the selected memory 10 is completed, the controller 100 sets the chip enable signal CEn of the selected memory 10 to an "H" level, and sets the ODT enable signal ODTEN "to an "L" level. When the ODT enable signal ODTEN is at an "L" level, the non-selected memory 10 in which the ODT circuit 60 is usable turns off the ODT circuit 60.

3.4 Control of ODT Circuit in Read Operation

Hereinafter, the transmission and reception of the signal between the controller 100 and the memory 10 in the read operation will be described with reference to FIG. 16.

Figure 16:
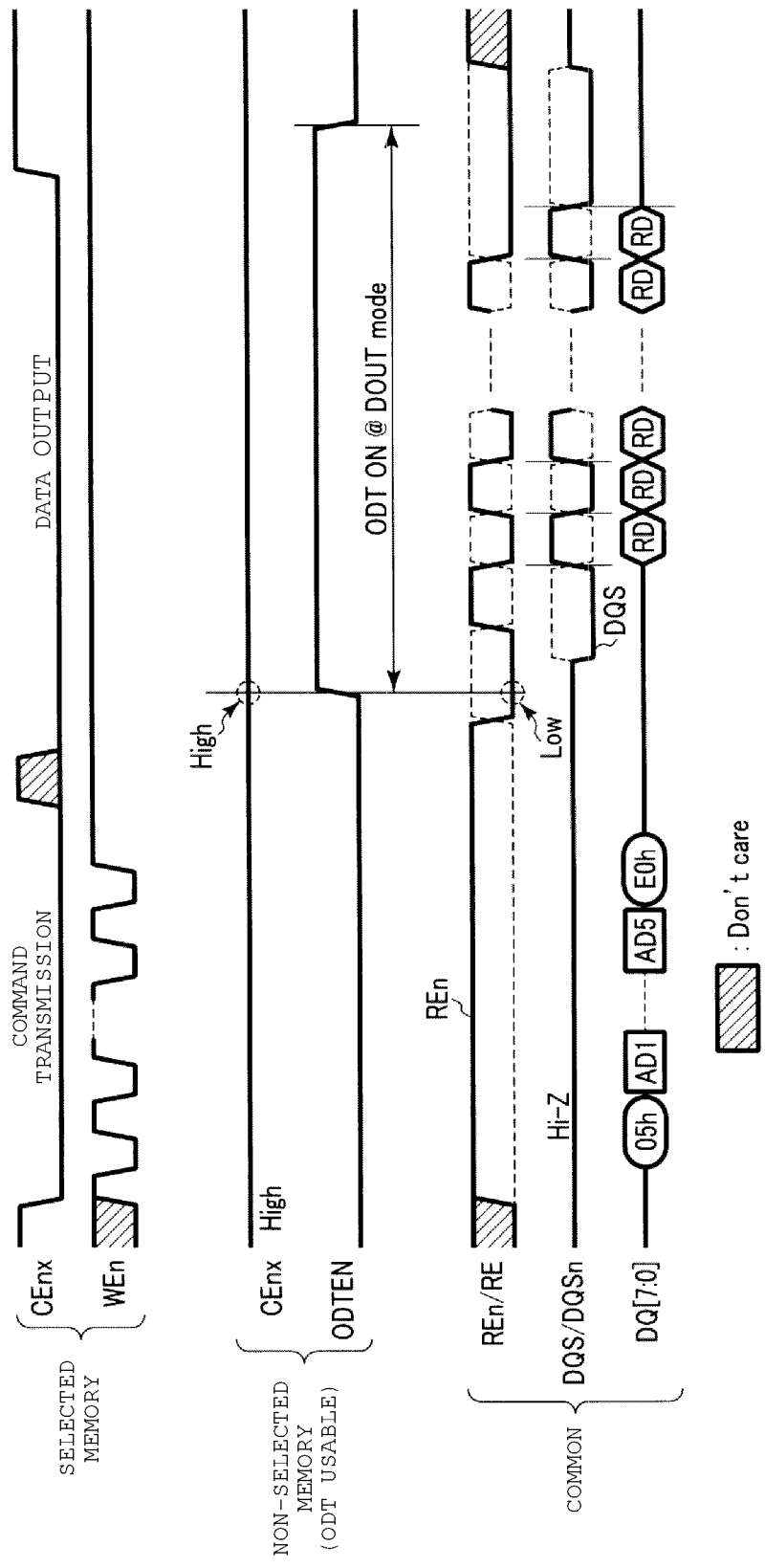
FIG. 16 is a timing chart of signals during a read operation carried out in the memory system according to the third embodiment.

As shown in FIG. 16, initially, the controller 100 asserts the chip enable signal CEnx of the selected memory 10 (to an "L" level). The controller 100 maintains the chip enable signal CEnx at an "H" level during the reading of the chip enable signal CEnx in the non-selected memory.

Subsequently, the controller 100 issues the command and the address data for the read operation, and sets the read enable signal REn to an "L" level during a REn maintaining period. The controller 100 sets the ODT enable signal ODTEN to an "H" level within this period. In the non-selected memory 10 in which the ODT circuit 60 is usable, since the chip enable signal CEnx is at an "H" level and the read enable signal REn is at an "L" level, the ODT control circuit 52 selects the DOUT mode, and turns on the corresponding ODT circuit 60.

When the read operation of the selected memory 10 is completed, the controller 100 sets the chip enable signal CEnx of the selected memory 10 to an "H" level, and sets the ODT enable signal ODTEN to an "L" level. When the ODT enable signal ODTEN is set to an "L" level, the non-selected memory 10 in which the ODT circuit 60 is usable turns off the ODT circuit 60.

3.5 Operation Timing of ODT Circuit

Hereinafter, an ON/OFF switching timing of the ODT enable signal ODTEN and the ODT circuit 60 will be described with reference to FIG. 17.

Figure 17:
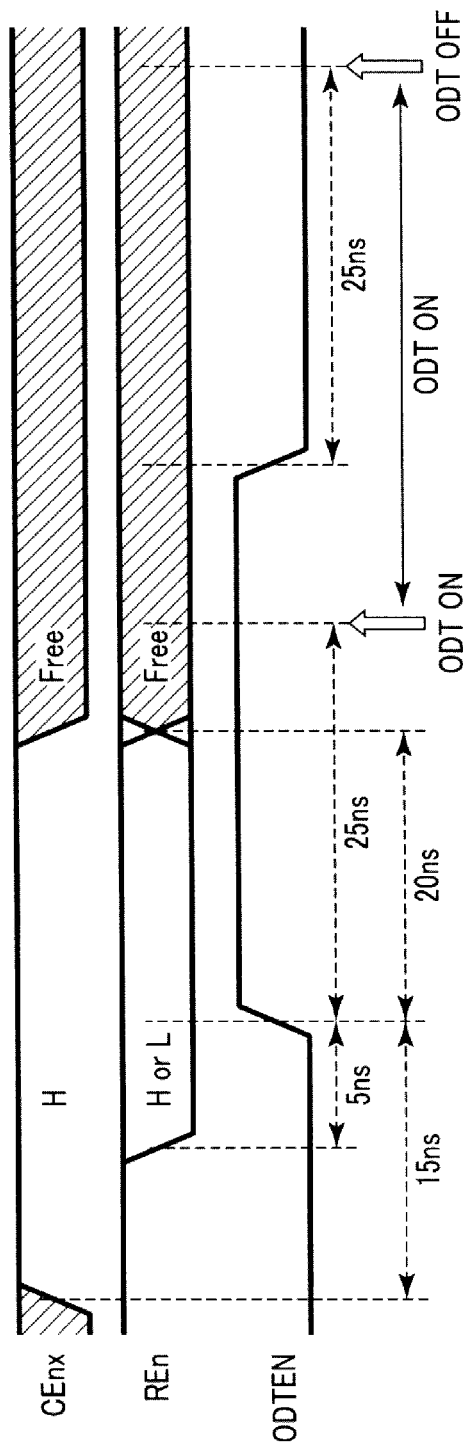
FIG. 17 is a timing chart showing a relationship between control signals and an operation timing of the ODT circuit in the memory system according to the third embodiment.

As shown in FIG. 17, the controller 100 sets the chip enable signal CEnx of the non-selected memory 10 to an "H" level in a state in which the chip enable signal CEnx becomes valid (a state in which the memory 10 can receive various signals) after, for example, a waiting period tWHR elapses. Thereafter (for example, after 10 nsec), the controller 100 sets the read enable signal REn to an "H" level in the write operation. Meanwhile, in the read operation, the controller 100 sets the read enable signal REn to an "L" level, and maintains the read enable signal at an "L" level for the REn maintaining period (25 nsec or longer).

The controller 100 switches the ODT enable signal ODTEN from an "L" level to an "H" level during a period from a time at which 5 nsec or longer elapses since the starting (that is, the ending of the waiting period tWHR) of the REn maintaining period until the REn maintaining period is ended. For example, in the example of FIG. 17, the ODT enable signal ODTEN is set to an "H" level after 5 nsec (after 15 sec from a state in which the chip enable signal CEnx becomes valid) from the starting of the REn maintaining period after 10 nsec from a state in which the chip enable signal CEnx becomes valid.

The ODT control circuit 52 latches the chip enable signal CEnx and the read enable signal REn and selects the control mode of the ODT circuit 60 at a timing when the ODT enable signal ODTEN is switched from an "L" level to an "H" level, and turns on the corresponding ODT circuit 60 after, for example, 25 nsec elapses.

3.6 Advantage of Present Embodiment

The present embodiment can be combined with the first and second embodiments. Thus, it is possible to obtain the same advantage as that of the first and second embodiments.

In the configuration according to the present embodiment, the controller 100 transmits a different chip enable signal CEnx to each memory 10. The ODT control circuit 52 can select the control mode of the ODT circuit 60 based on the chip enable signal CEnx and the read enable signal REn. Thus, the ODT control circuit 52 can operate the ODT circuit 60 only when the corresponding memory 10 (or the memory chip 70) is in the non-selection state (state in which the chip enable signal CEnx is at an "H" level). That is, the memory system 1 can control the more optimum ODT circuit 60 depending on the selected memory 10. Thus, it is possible to effectively reduce the noise due to the reflection of the signal, and thus, it is possible to improve the quality of the signal.

4. Fourth Embodiment

Hereinafter, a fourth embodiment will be described. There is a difference from the third embodiment in that the ODT circuit 60 is turned on when the ODT enable signal ODTEN and the chip enable signal CEnx are at an "H" level. Only a difference from the third embodiment will be described below.

4.1 Control Mode Selection of ODT Circuit

Initially, the selection of the control mode of the ODT circuit 60 will be described with reference to FIG. 18.

As shown in FIG. 18, when the chip enable signal CEnx and the ODT enable signal ODTEN are set to an "H" level, if the read enable signal REn is at an "H" level, the ODT control circuit 52 selects the DIN mode, and turns on the corresponding ODT circuit 60. Meanwhile, if the read enable signal REn is at an "L" level, the ODT control circuit 52 selects the DOUT mode, and turns on the corresponding ODT circuit 60. The ODT control circuit 52 latches the read enable signal REn when the ODT circuit 60 is turned on. Thus, even though the read enable signal REn is changed from an "H" level to an "L" level or from an "L" level to an "H" level for a period during which the ODT circuit 60 is turned on, the ODT control circuit 52 maintains the DIN mode or the DOUT mode until the ODT circuit 60 is turned off.

When at least one of the latch enable signal CEnx and the ODT enable signal ODTEN is at an "L" level, the ODT control circuit 52 turns off the ODT circuit 60 irrespective of the read enable signal REn.

4.2 Operating Timing of ODT Circuit

Figure 19:
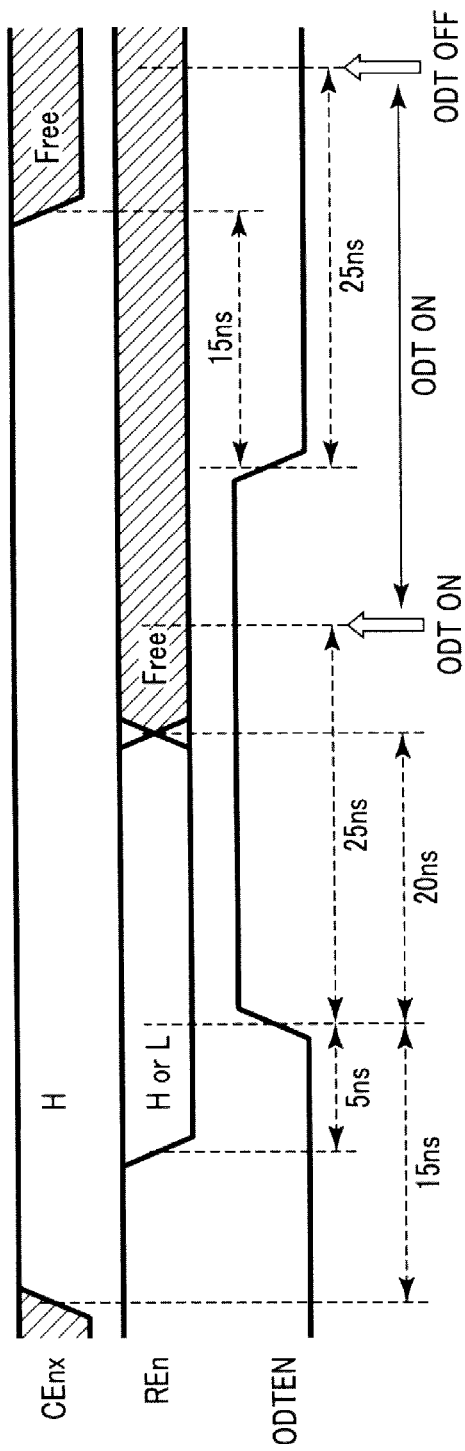
FIG. 19 is a timing chart showing a relationship between an operation timing of the ODT circuit and various control signals in the memory system according to the fourth embodiment.

Hereinafter, An ON/OFF switching timing of the ODT enable signal ODTEN and the ODT circuit 60 will be described with reference to FIG. 19. In FIG. 19, the chip enable signal CEnx of the non-selected memory 10 is maintained at an "H" level when the ODT enable signal ODTEN is at an "H" level.

As shown in FIG. 19, similarly to the third embodiment, the controller 100 sets the chip enable signal CEnx of the non-selected memory 10 to an "H" level in a state in which the chip enable signal CEnx becomes valid (state in which the memory 10 can receive various signals). Thereafter, the controller 100 switches the ODT enable signal from an "L" level to an "H" level in a period from a time at which 5 nsec or longer elapses since the starting of the REn maintaining period until the REn maintaining period is ended.

The ODT control circuit 52 latches the read enable signal REn and selects the control mode of the ODT circuit 60 at a timing when both the chip enable signal CEnx and the ODT enable signal ODTEN are set to an "H" level. The ODT control circuit 52 turns on the corresponding ODT circuit 60 after, for example, 25 nsec elapses from a state in which the ODT enable signal ODTEN is switched from an "L" level to an "H" level.

Subsequently, the controller 100 switches the ODT enable signal ODTEN from an "H" level to an "L" level. The controller 100 maintains the chip enable signal CEnx at an "H" level until, for example, 15 nsec or longer elapses after the ODT enable signal ODTEN is switched from an "H" level to an "L" level. The ODT control circuit 52 turns off the corresponding ODT circuit 60 after, for example, 25 nsec elapses from a state in which the ODT enable signal ODTEN is switched from an "H" level to an "L" level.

The controller 100 may previously switch the ODT enable signal ODTEN from an "L" level to an "H" level such that the chip enable signal CEnx becomes valid. The controller 100 may switch the chip enable signal CEnx from an "H" level to an "L" level earlier than the ODT enable signal ODTEN.

4.3 Advantage of Present Embodiment

The present embodiment can be combined with the first and second embodiments, and thus, it is possible to obtain the same advantage as that of the first and second embodiments.

Further, according to the present embodiment, it is possible to obtain the same advantage as that of the third embodiment.

Moreover, according to the present embodiment, the ODT control circuit 52 can turn on the ODT circuit 60 when both the chip enable signal CEnx and the ODT enable signal ODTEN are at an "H" level.

5. Fifth Embodiment

Hereinafter, a fifth embodiment will be described. A difference from the first to fourth embodiments is that the write protect signal WPn has a function of the write protect control signal and a function of the control signal of the ODT circuit 60. In the present embodiment, two examples will be described. Only a difference from the first to fourth embodiments will be described below.

5.1 First Example

Initially, a first example of the present embodiment will be described. In the present example, the functions of the signal input from the terminal are different before and after the parameter is set by the Set Feature.

5.1.1 Entire Configuration of Memory System

The entire configuration of the memory system 1 will be described. In the memory system 1 according to the present example, the controller 100 transmits different write protect signals WPn to the memories 10 (10_0, 10_1, 10_2, by using individual signal lines. Hereinafter, the write protect signal transmitted from the controller 100 to each memory 10 is referred to as a write protect signal "WPnx", and a terminal corresponding to the write protect signal WPnx of each memory 10 is referred to as a "WPnx terminal". Thus, in the present example, the write protect signal WPn is replaced with WPnx and the terminal corresponding to the ODT enable signal ODTEN is not used in FIGS. 3 and 5 of the first embodiment or FIG. 13 of the second embodiment.

The latch enable signal CEn, the command latch enable signal CLE, the address latch enable signal ALE and the write enable signal WEn may be transmitted using a common signal line, or may be transmitted using individual signal lines.

5.1.2 Signal of WPnx Terminal

Initially, relationship between the signal of the WPnx terminal and the memory 10 will be described with reference to FIG. 20.

As shown in FIG. 20, the signal (write protect signal WPnx) of the WPnx terminal functions as the write protect control signal until the parameter regarding the ODT circuit 60 is set by the Set Feature (until the first operation), and functions as the control signal (ODT enable signal ODTEN) of the ODT circuit 60 after the parameter is set.

More specifically, the controller 100 sets the write protect signal WPnx to an "L" level in order to prevent the write operation from being carried out in a state in which the power supply voltage is unstable when the memory 10 is started (powered ON). In this case, the write protect signal WPnx is processed as the write protect control signal, and the memory 10 prohibits the write operation (enables the write protect) for a period during which the write protect signal WPnx is at an "L" level.

After the power supply voltage is fixed (stable), the controller 100 sets the write protect signal WPnx to an "H" level. In this case, the write protect signal WPnx is processed as the write protect control signal, and the memory 10 releases the prohibition of the write operation.

Subsequently, the controller 100 performs the Set Feature, and sets the parameter regarding the ODT circuit 60. The memory 10 processes the write protect signal WPnx as the ODT enable signal ODTEN after the parameter is set (the Set Feature is performed). More specifically, when the write protect signal WPnx is at an "L" level, the ODT control circuit controls such that the ODT circuit 60 is turned on. Meanwhile, when the write protect signal WPnx is at an "H" level, the ODT control circuit 52 controls such that the ODT circuit 60 is turned off.

5.1.3 Control Mode Selection of ODT Circuit

The relationships of FIGS. 7, 14 and 18 described in the first, third, and fourth embodiments can be used as the control mode of the ODT circuit 60 according to the present example. In this case, the ODT enable signal ODTEN may be replaced with the write protect signal WPnx.

5.2 Second Example

Hereinafter, a second example of the present embodiment will be described. The second example corresponds to a case where the write protect signal WPnx has a function of the write protect control signal even after the Set Feature is performed in the first example. Only a different from the first example will be described below.

5.2.1 Entire Configuration of Memory System

The entire configuration of the memory system 1 will be described. In the memory system 1 according to the present example, the controller 100 respectively transmits different write protect signals WPnx and chip enable signals CEnx to the memories 10 (10_0, 10_1, 10_2, . . . ) by using individual signal lines.

The command latch enable signal CLE, the address latch enable signal ALE, and the write enable signal WEn may be transmitted using a common signal line, or may be transmitted using individual signal lines.

5.2.2 Control Mode Selection of ODT Circuit

Initially, the selection of the control mode of the ODT circuit 60 will be described with reference to FIG. 21.

As shown in FIG. 21, the ODT control circuit 52 latches the chip enable signal CEnx (individually for each memory 10), the command latch enable signal CLE, the address latch enable signal ALE, the write enable signal WEn, and the read enable signal REn at a timing when the write protect signal WPnx is switched from an "H" level to an "L" level. When the chip enable signal CEnx and the write enable signal WEn are set to an "H" level and the command latch enable signal CLE and the address latch enable signal ALE are set to an "L" level, the ODT control circuit 52 determines that the write protect signal WPnx is the control signal of the ODT circuit 60. When the read enable signal REn is set to an "H" level, the ODT control circuit 52 selects the DIN mode, and turns on the corresponding ODT circuit 60. Meanwhile, when the read enable signal REn is set to an "L" level, the ODT control circuit 52 selects the DOUT mode, and turns on the corresponding ODT circuit 60.

When combinations of the chip enable signal CEnx, command latch enable signal CLE, the address latch enable signal ALE, and the write enable signal WEn other than the above-described combination are used, the ODT control circuit 52 turns off the ODT circuit 60. The memory 10 determines that the write protect signal WPnx is the write protect control signal, and prohibits the write operation.

The ODT control circuit 52 turns off the ODT circuit 60 for a period during which the write protect signal WPnx is at an "H" level.

5.2.3 Control of ODT Circuit in Write Operation

Hereinafter, the transmission and reception of the signal between the controller 100 and the memory 10 in the write operation will be described with reference to FIG. 22. In FIG. 22, the command latch enable signal CLEx, the address latch enable signal ALEx, and the write enable signal WEnx are different between the memories 10.

As shown in FIG. 22, the controller 100 maintains the latch enable signals CEnx and the write enable signals WEnx in the non-selected memory 10 at an "H" level during the write operation, and maintain the command latch enable signals CLEx and the address latch enable signals ALEx at an "L" level.

The controller 100 issues the command and the address data for the write operation, and then sets the write protect signal WPnx to an "L" level. In this case, in the non-selected memory 10 in which the ODT circuit 60 is usable, since the latch enable signal CEnx, the write enable signal Wen, and the read enable signal REn are set to an "H" level and the command latch enable signal CLE and the address latch enable signal ALE are set to an "L" level, the ODT control circuit 52 selects the DIN mode, and turns on the corresponding ODT circuit 60.

When the write operation in the selected memory 10 is completed, the controller 100 sets the chip enable signal CEn of the selected memory 10 to an "H" level, and sets the write protect signal WPnx to an "H" level. In the non-selected memory 10 in which the ODT circuit 60 is usable, when the write protect signal WPnx is set to an "H" level, the ODT control circuit 52 turns off the ODT circuit 60.

5.2.4 Control of ODT Circuit in Read Operation

Figure 23:
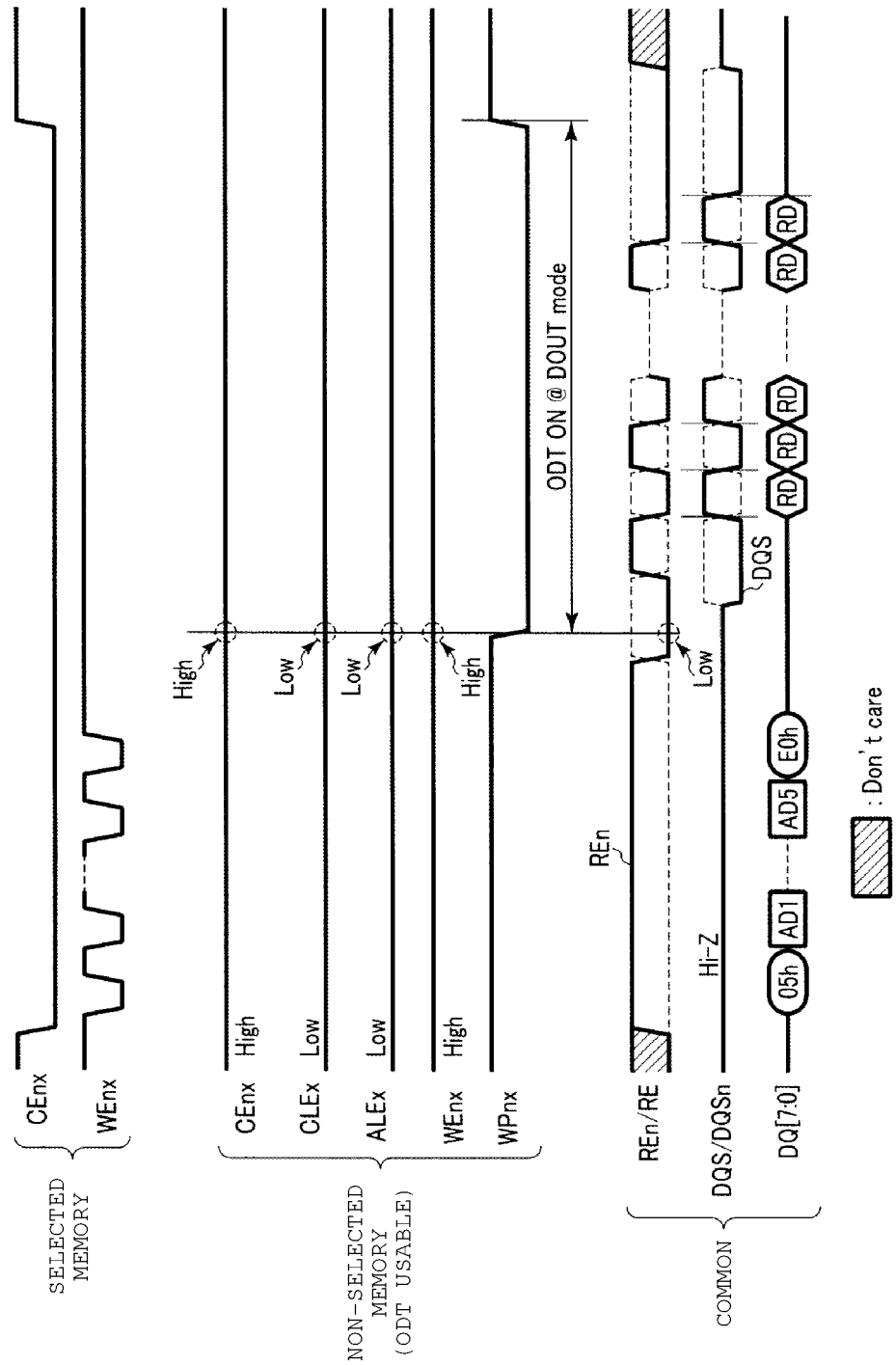
FIG. 23 is timing chart of signals during a read operation carried out in the memory system according to the second example of the fifth embodiment.

Hereinafter, the transmission and reception of the data between the controller 100 and the memory 10 in the read operation will be described with reference to FIG. 23. In the example of FIG. 23, similarly to FIG. 22, a case where the command latch enable signal CLEx, the address latch enable signal ALEx and the write enable signal WEnx are different between the memories 10 will be described.

As shown in FIG. 23, the controller 100 maintains the chip enable signal CEnx and the write enable signal WEnx of the non-selected memory 10 at an "H" level and maintain the command latch enable signal CLEx and the address latch enable signal ALEx at an "L" level during the read operation.

The controller 100 issues the command and the address data for the read operation, and then sets the read enable signal REn to an "L" level during the REn maintaining period. The controller 100 sets the write protect signal WPnx to an "L" level during this period. In the non-selected memory 10 in which the ODT circuit 60 is usable, since the chip enable signal CEnx and the write enable signal WEn are set to an "H' level and the command latch enable signal CLE, the address latch enable signal ALE and the read enable signal REn are set to an "L" level, the ODT control circuit 52 selects the DOUT mode, and turns on the corresponding ODT circuit 60.

When the read operation of the selected memory 10 is completed, the controller 100 sets the chip enable signal CEnx of the selected memory 10 to an "H" level, and sets the write protect signal WPnx to an "H" level. In the non-selected memory 10 in which the ODT circuit 60 is usable, when the write protect signal WPnx is set to an "H" level, the ODT control circuit 52 turns off the ODT circuit 60.

5.2.5 Operation Timing of ODT Circuit

Hereinafter, the ON/OFF switching timing of the write protect signal WPnx and the ODT circuit 60 will be described with reference to FIG. 24.

Figure 24:
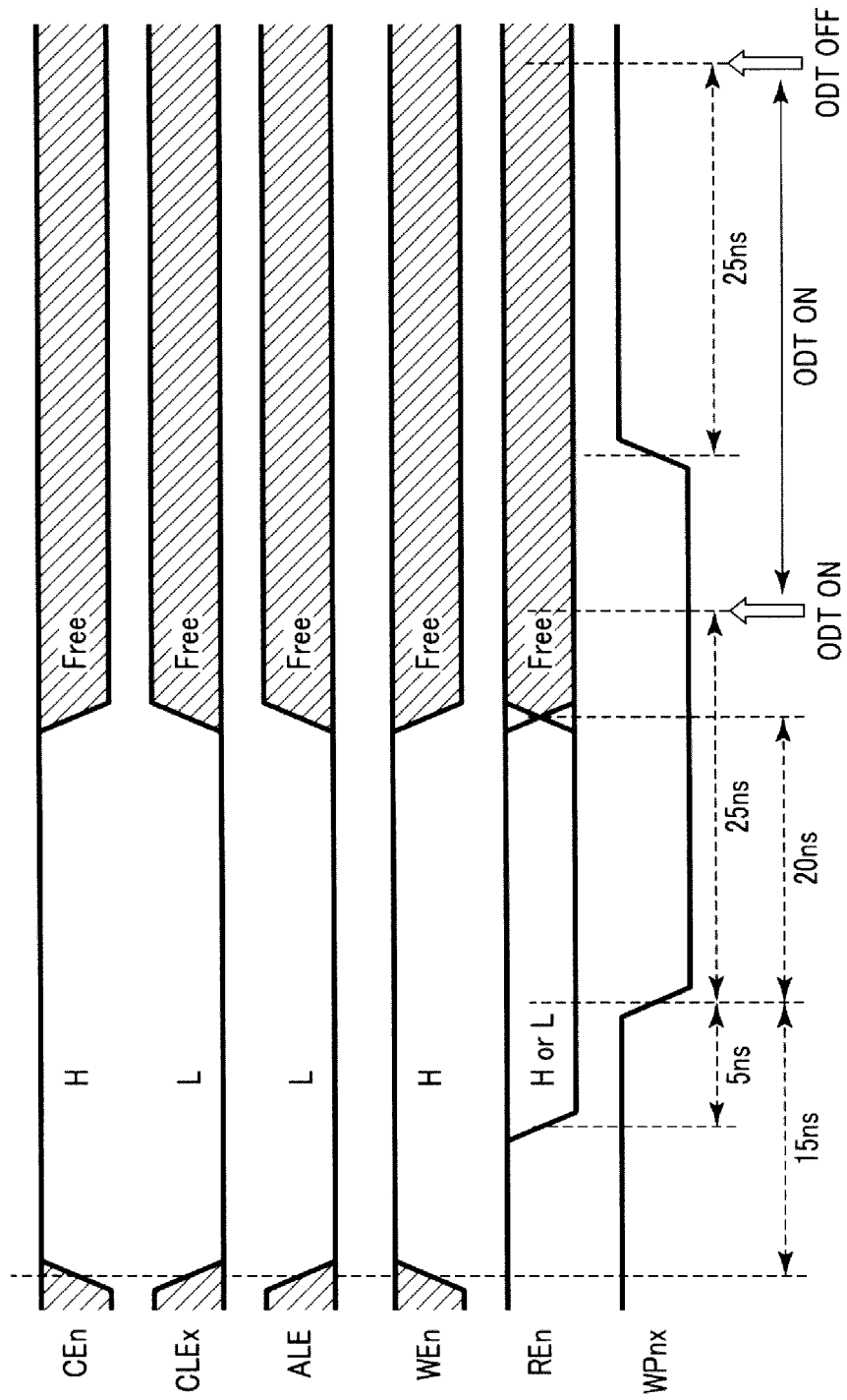
FIG. 24 is a timing chart showing a relationship between an operation timing of the ODT circuit and various control signals in the memory system according to the second example of the fifth embodiment.

As shown in FIG. 24, in a state in which various signals are valid (state in which the memory 10 can receive various signals) after, for example, a waiting period tWHR elapses, the controller 100 sets the chip enable signal CEnx, the write enable signal WEnx and the read enable signal REn of the non-selected memory 10 to an "H" level, and sets the command latch enable signal CLEx and the address latch enable signal ALEx to an "L" level. Thereafter, the controller 100 switches the write protect signal WPnx from an "H" level to an "L" level in a period from a time at which the 5 nsec or longer elapses since starting of the REn maintaining period until the REn maintain period is ended.

The ODT control circuit 52 latches the chip enable signal CEnx, the command latch enable signal CLEx, the address latch enable signal ALEx, the write enable signal WEnx, and the read enable signal REn at a timing when the write protect signal WPnx is switched to an "H" level. In FIG. 24, since the chip enable signal CEnx and the write enable signal WEnx are set to an "H" level and the command latch enable signal CLEx and the address latch enable signal ALEx are set to an "L" level, the ODT control circuit 52 processes the write protect signal WPnx as the control signal of the ODT circuit 60, and selects the DIN/DOUT mode depending on the "H"/"L" level of the read enable signal REn. The corresponding ODT circuit 60 is turned on after, for example, 25 nsec elapses from a state in which the signal of the WPnx terminal is switched from an "H" level to an "L" level.

Subsequently, the controller 100 switches the write protect signal WPnx from an "L" level to an "H" level. The ODT control circuit 52 turns off the corresponding ODT circuit 60 after, for example, 25 nsec elapses from a state in which the write protect signal WPnx is switched from an "L" level to an "H" level.

5.3 Advantage of Present Embodiment

According to the present embodiment, it is possible to obtain the same advantage as the first to fourth embodiments.

In the present embodiment, it is possible to allow the write protect signal WPnx to have a function of the control signal of the write protect and a function of the control signal of the ODT circuit 60. That is, the write protect signal WPn and the ODT enable signal ODTEN can be a common signal. Thus, the terminals corresponding to the ODT enable signals ODTEN of the controller 100 and the memory 10 and the data lines for transmitting and receiving the ODT enable signal ODTEN can be omitted. Accordingly, it is possible to prevent the number of terminals and the number of data lines from being increased in the memory system, and thus, it is possible to prevent a chip area from being increased.

In the present embodiment, even after the parameter of the ODT circuit 60 is set due to the Set Feature, it is possible to allow one signal to have a function of the write protect control signal and a function of the control signal of the ODT circuit 60. More specifically, the memory 10 latches the chip enable signal CEnx, the command latch enable signal CLEx, the address latch enable signal ALEx, the write enable signal WEnx, and the read enable signal REn at a timing when the write protect signal WPnx is switched from an "H" level to an "L" level. The memory 10 can determines whether or not the write protect signal WPnx is the write protect control signal or the control signal of the ODT circuit 60 depending the state of each signal. It is possible to prevent the malfunction of the ODT circuit 60 and the write protect by performing the determination using the chip enable signal CEnx, the command latch enable signal CLEx, the address latch enable signal ALEx, the write enable signal WEnx and the read enable signal REn. Accordingly, it is possible to improve the reliability of the memory system.

Although it has been described in the present embodiment that it is determined whether or not the signal of the WPnx terminal is the write protect signal WPnx or the ODT enable signal ODTENx by using the chip enable signal CEnx, the command latch enable signal CLEx, the address enable signal ALEx, and the write enable signal WEnx, the type of the signals used in the determination and the combination of the logic levels of the signals are not limited.

Although the write protect signal WPnx has a function of the ODT enable signal ODTEN in the present example, a signal that having the function of the ODT enable signal ODTEN is not limited to the write protect signal WPnx.

6. Sixth Embodiment

Hereinafter, a sixth embodiment will be described. The sixth embodiment corresponds to a case where the chip enable signal CEnx, the command latch enable signal CLEx, the address latch enable signal ALEx, the write enable signal WEnx, the address latch enable signal ALEx, and the write enable signal WEnx are not latched in the second example of the fifth embodiment. Only a difference from the second example of the fifth embodiment will be described below.

6.1 Entire Configuration of Memory System

Initially, the entire configuration of the memory system 1 will be described. In the memory system 1 according to the present embodiment, the write protect signal WPnx, the command latch enable signal CLEx, the address latch enable signal ALEx, and the write enable signal WEnx are transmitted from the controller 100 to the memories 10 by using individual signal lines.

6.2 Control Mode Selection of ODT Circuit

Hereinafter, the selection of the control mode of the ODT circuit 60 will be described to FIG. 25.

Figures 25, 26:
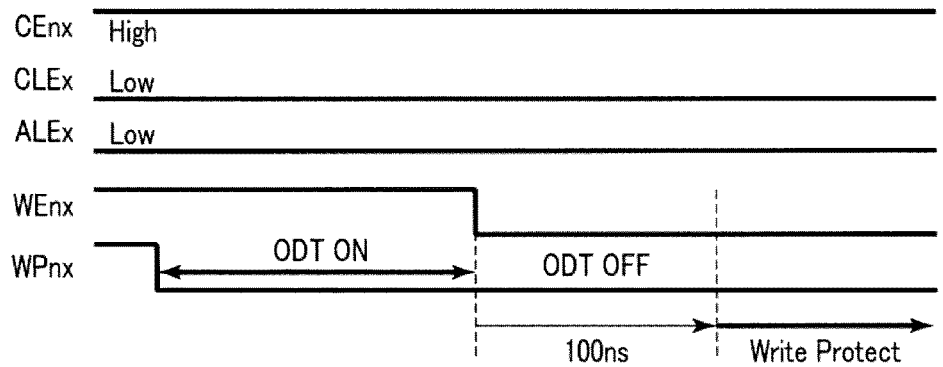
FIG. 25 illustrates a relationship between logic states of various control signals and a control mode of the ODT circuit in a memory system according to a sixth embodiment.
FIG. 26 is a timing chart of signals until the ODT circuit is changed to a write protect state after the ODT circuit is turned off in the memory system according to the sixth embodiment.

As shown in FIG. 25, when the latch enable signal CEnx and the write enable signal WEnx are set to an "H" level and the command latch enable signal CLEx, the address latch enable signal ALEx and the write protect signal WPnx are set to an "L" level, if the read enable signal REn is at an "H" level, the ODT control circuit 52 selects the DIN mode, and turns on the ODT circuit 60. Meanwhile, if the read enable signal REn is at an "L" level, the ODT control circuit 52 selects the DOUT mode, and turns of the ODT circuit 60. The ODT control circuit 52 latches the read enable signal REn when the ODT circuit 60 is turned on. Thus, even though the read enable signal REn is changed from an "H" level to an "L" level or from an "L" level to an "H" level for a period during which the ODT circuit 60 is turned on, the ODT control circuit 52 maintains the DIN mode or the DOUT mode until the ODT circuit 60 is turned off.

When the write protect signal WPnx is at an "L" level in a state in which at least one of the latch enable signal CEnx, the command latch enable signal CLEx, the address latch enable signal ALEx, and the write enable signal WEnx is not at the above-describe logic level, the ODT control circuit 52 turns off the ODT circuit 60. Then, the memory 10 turns into a write protect state, and prohibits the writing. Accordingly, even when the ODT circuit 60 is turned on, when the logic level of at least one of the chip enable signal CEnx, the command latch enable signal CLEx, the address latch enable signal ALEx, and the write enable signal WEnx is inverted, the memory 10 turns off the ODT circuit 60, and is changed to the write protect state.

When the write protect signal WPnx is at an "H" level, the ODT control circuit 52 turns off the ODT circuit 60.

6.3 State Change of ODT Circuit from Control State to Write Protect State

Hereinafter, a timing when the control state of the ODT circuit 60 is changed to a write protect state will be described with reference to FIG. 26.

As shown in FIG. 26, when the write protect signal WPnx is changed from an "H" level to an "L" level in a state in which the chip enable signal CEnx and the write enable signal WEnx are set to an "H" level and the command latch enable signal CLEx and the address latch enable signal ALEx are set to an "L" level, the ODT control circuit 52 turns on the ODT circuit 60.

In this case, for example, when the write enable signal WEnx is changed from an "H" level to an "L" level, the ODT control circuit 52 turns off the ODT circuit 60. The memory 10 is changed to the write protect state after, for example, 100 nsec elapses from a state in which the ODT circuit is turned off.

Although in FIG. 26 the write enable signal WEnx is switched from an "H" level to an "L" level, the logic level of any one signal of the chip enable signal CEnx, the command latch enable signal CLEx, and the address latch enable signal ALEx may be switched.

6.3 Advantage of Present Embodiment

In the configuration according to the present embodiment, it is possible to obtain the same advantage as that of the first to fifth embodiments.

In the present embodiment, it is possible to continuously change the OFF operation of the ODT circuit 60 and the change of the ODT circuit to the write protect state by changing the logic level of any one of the chip enable signal CEnx, the command latch enable signal CLEx, the address latch enable signal ALEx, and the write enable signal WEnx in a state in which the ODT circuit 60 is turned on.

7. Seventh Embodiment

Hereinafter, a seventh embodiment will be described. A difference from the first to sixth embodiments is that the control mode of the ODT circuit 60 is set to any one of the DIN mode and the DOUT mode during the Set Feature. Only a difference from the first to sixth embodiments will be described below.

7.1 Control Flow of ODT Circuit

The control flow of the ODT circuit 60 will be described with reference to FIG. 27.

Figure 27:
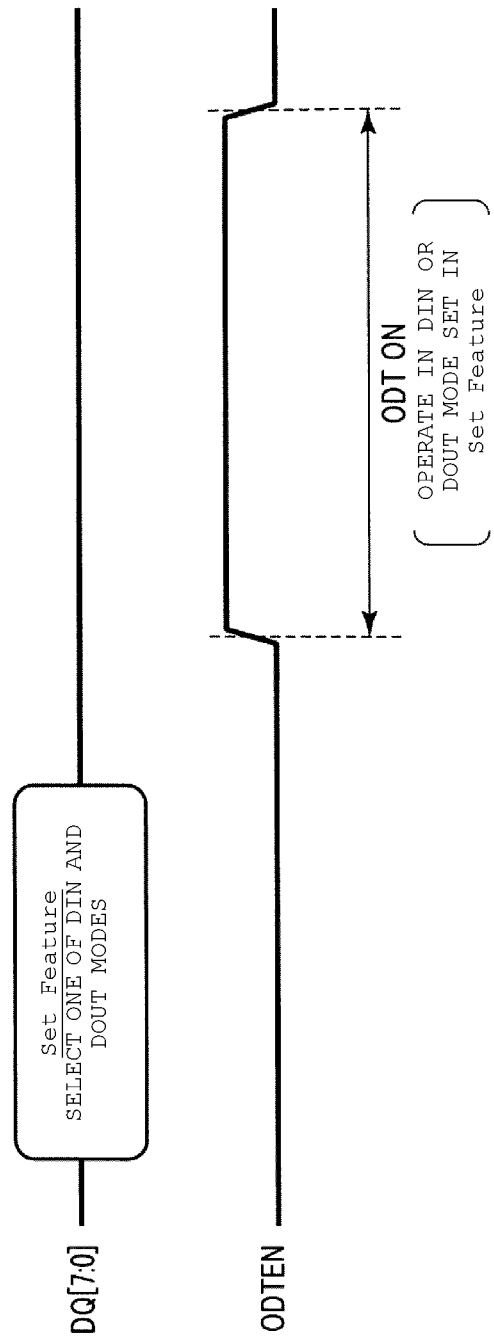
FIG. 27 illustrates a relationship between a first operation and a second operation in a memory system according to a seventh embodiment.

As shown in FIG. 27, when the Set Feature (first operation) is carried out, the controller 100 initially selects anyone of the DIN mode and the DOUT mode, and sets the parameter.

Subsequently, when the write or read operation is performed, the controller 100 changes the ODT enable signal ODTEN from an "L" level to an "H" level. The ODT control circuit 52 turns on the corresponding ODT circuit 60 in the DIN mode or the DOUT mode which is previously set in the Set Feature for a period during which the ODT enable signal ODTEN is at an "H" level.

7.2 Advantage of Present Embodiment

According to the present embodiment, it is possible to obtain the same advantage as that of the first to sixth embodiments.

In the present embodiment, the ODT control circuit 52 can control the operation of the ODT circuit 60 without selecting the control mode of the ODT circuit 60 by previously setting any one of the DIN mode and the DOUT mode due to the Set Feature. Thus, it is possible to simplify the configuration of the ODT control circuit 52, and thus, it is possible to reduce the circuit area of the ODT control circuit 52. Accordingly, it is possible to prevent the chip area from being increased.

8. Eighth Embodiment

Hereinafter, an eighth embodiment will be described. The eighth embodiment corresponds to a case where the memory chips 70a to 70h that turn on the ODT circuits 60 are selected by the chip address data CADD in the second embodiment. Only a difference from the second embodiment will be described below.

8.1 Selection of Memory Chip

Figure 28:
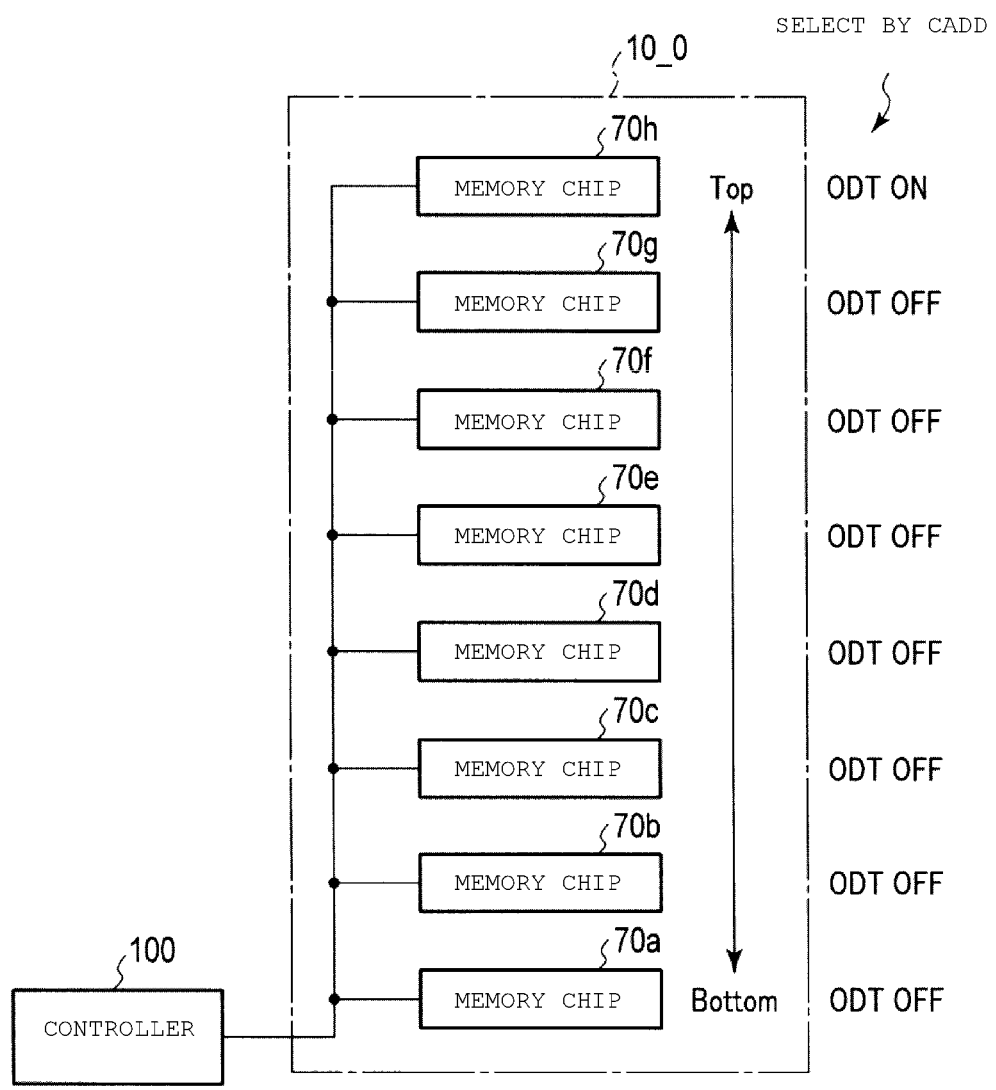
FIG. 28 illustrates an ODT operation target in a memory system according to an eighth embodiment.

The selection of the memory chips 70a to 70h will be simply described with reference to FIG. 28. FIG. 28 is an explanatory diagram obtained by simplifying FIG. 12 of the second embodiment. Although the topmost memory chip 70h is selected in FIG. 28, the present embodiment is not limited thereto. The plurality of memory chips 70 may be selected.

As shown in FIG. 28, the ODT control circuits 52 of the memory chip 70 (70a to 70h) check the positions of the memories 10 on which the mounted memory chips 70 are mounted by the chip address data CADD transmitted from the controller 100 when the write or read operation is performed. For example, when the memory chip is the topmost memory chip 70h, the ODT control circuit 52 turns on the corresponding ODT circuit 60 in response to the ODT enable signal ODTEN. Instead of receiving from the controller, the chip address data CADD may be stored in the memory chips 70 and retrieved therefrom.

8.2 Advantage of Present Embodiment

According to the present embodiment, it is possible to obtain the same advantage as that of the second embodiment.

In the present embodiment, it is possible to operate the ODT circuit 60 by selecting only the memory chip 70 of the memory 10 which is effective in reducing the reflected signal by the chip address data CADD. Accordingly, it is possible to control the more optimum ODT circuit 60, and thus, it is possible to more effectively the noise due to the reflection of the signal. As a result, it is possible to improve the quality of the signal.

In the present embodiment, since it is possible to check the memory chip 70 which is a writing or reading target by the chip address data CADD, it is possible to control the operation of the ODT circuit 60 depending on the target memory chip 70. Accordingly, it is possible to control the more optimum ODT circuit 60, and thus, it is possible to more effectively reduce the noise due to the reflection of the signal. As a result, it is possible to improve the quality of the signal.

In the present embodiment, even though the ODT enable signal ODTEN is common to the memory chips 70, it is possible to select the memory chip 70 that turns on the ODT circuit 60 by the chip address data CADD. Thus, it is possible to use a common signal line as the signal lines of the ODT enable signals that connect the controller 100 and the memories 10. Accordingly, it is possible to simplify the configuration of the memory system, and thus, it is possible to prevent the chip area from being increased.

9. Modification Examples

The memory system of the above-described embodiment includes the first nonvolatile semiconductor memory device (10 of FIG. 1), and the controller (100 of FIG. 1). The controller can transmit and receive the first signal, and the second signal (REn of FIG. 3) that controls the timing when the data is read in the read operation to and from the first nonvolatile semiconductor memory device. The first nonvolatile semiconductor memory device includes the first terminal which is connected to the controller and receives the second signal, the first circuit (60 of FIG. 3) that includes the first and second resistance elements (63*a* and 63*b* of FIG. 4) which are connected to the first terminal, the first switch element (61 of FIG. 4) which electrically connects the first resistance element to the power supply voltage line (VCC of FIG. 4) and the second switch element (62 of FIG. 4) which electrically connects the second resistance element to the ground voltage line (VSS of FIG. 4), and the second circuit (52 of FIG. 3) that controls the first circuit by using the first signal (ODTEN of FIG. 3). When the logic level of the first signal is switched (L→H of FIG. 7), the second circuit turns off the first and second switch elements when the second signal is at the first logic level (H of FIG. 7), and turns on the first and second switch elements when the second signal is at the second logic level (L of FIG. 7).

It is possible to provide the nonvolatile semiconductor memory device and the memory system capable of improving processing performance, according to the above-described embodiments.

Embodiments are not limited to the above-described embodiments, and may be modified. The embodiments may be combined as possible. For example, the first example of the fifth embodiment and the eighth embodiment may be combined with the second embodiment, so that the terminal corresponding to the ODT enable signal ODTEN may be omitted and the memory chip 70 that turns on the ODT circuit 60 may be selected by the chip address data CADD.

In the above-described embodiments, the controller 100 may include the ODT circuit 60. For example, when the signal is transmitted and received between the memories 10, the ODT circuit 60 of the controller 100 may be turned on.

Although the ODT circuit 60 is connected to the terminals corresponding to the data line DQ[7:0] in the above-described embodiments, the clock signals DQS and DQSn and the read enable signals REn and RE, the terminals to which the ODT circuit 60 is connected are not limited thereto.

Although the ODT circuit 60 connected to the terminals corresponding to the read enable signals REn and RE are turned off in the DIN mode and is turned on in the DOUT mode in the above-described embodiments, the ODT circuit 60 of which the ON and OFF states are switched in the DIN mode and the DOUT mode is not limited thereto.

In the above-described embodiments, different resistance values may be set to the variable resistance elements 63*a* and 63*b* of the ODT control circuit 52 in the DIN mode and the DOUT mode.

In the above-described embodiments, the interface chip 20 (or the memory chip 70) that uses the ODT circuit 60 is not limited to the non-selected memory 10 (or the memory chip 70).

The above-described embodiments may be applied to any one of the plane NAND flash memory or the three-dimensional layered NAND flash memory.

For example, the "connection" in the above-described embodiments includes a state in which components are indirectly connected with another component such as a transistor or a resistor interposed therebetween.

The embodiments according to the present invention may be provided as follows. For example, when the memory cell transistor MT can retain 2-bit (four-value) data and threshold levels when any one of four values is retained are referred to as an E level (erase level), an A level, a B level, and a C level, (1) in the read operation, a voltage applied to a word line selected in a read operation at an A level is, for example, in a range of 0V to 0.55 V. The voltage is not limited to the above-described example, and may be in any range of 0.1 V to 0.21 V, 0.21 V to 0.31 V, 0.31 V to 0.4 V, 0.4 V to 0.5V, and 0.5 V to 0.55 V.

A voltage applied to a word line selected in a read operation at a B level is, for example, in a range of 1.5 V to 2.3 V. The voltage is not limited to the above-described example, and may be in any range of 1.65 V to 1.8 V, 1.8V to 1.95 V, 1.95 V to 2.1 V, and 2.1 V to 2.3V.

A voltage applied to a word line selected in a read operation at a C level is, for example, in a range of 3.0 V to 4.0 V. The voltage is not limited to the above-described example, and may be in any range of 3.0 V to 3.2 V, 3.2 V to 3.4 V, 3.4 V to 3.5 V, 3.5 V to 3.6 V, and 3.6 V to 4.0 V.

A time (tR) of the read operation may be, for example, in a range of 25 μs to 38 μs, 38 μs to 70 μs, or 70 μs to 80 μs.

(2) The write operation includes the program operation, and the verify operation, as described above. In the write operation, a voltage initially applied to a word line selected during the program operation is, for example, in a range of 13.7 V to 14.3 V. The voltage is not limited to the above-described example, and may be, for example, in any range of 13.7 V to 14.0 V, and 14.0 V to 14.6 V.

A voltage initially applied to a selected word line when an odd-numbered word line is written and a voltage initially applied to a selected word line when an even-numbered word line is written may be changed.

When the program operation is an incremental step pulse program (ISPP), for example, about 0.5 V is used as a step-up voltage.

A voltage applied to the non-selection word line may be, for example, in a range of 6.0 V to 7.3 V. The voltage is not limited to the above-described example, and the voltage may be, for example, in a range of 7.3 V to 8.4 V, or may be 6.0 V or less.

A pulse voltage to be applied may be changed depending on whether or not the non-selection word line is an odd-numbered word line or an even-numbered word line.

A time (tProg) of the write operation may be, for example, in a range of 1700 μs to 1800 μs, 1800 μs to 1900 μs, or 1900 μs to 2000 μs.

(3) In the erase operation, a voltage initially applied to a well which is formed on the semiconductor substrate and on which the memory cell is arranged is, for example, in a range of 12 V to 13.6 V. The voltage is not limited to the above-described example, and the voltage may be, for example, in a range of 13.6 V to 14.8 v, 14.8 V to 19.0 V, 19.0 V to 19.8 V or 19.8 V to 21 V.

A time (tErase) of the erase operation may be, for example, in a range of 3000 μs to 4000 μs, 4000 μs to 5000 μs, or 4000 μs to 9000 μs.

(4) The memory cell has a structure in which a charge storage layer is arranged on the semiconductor substrate (silicon substrate) with a tunnel insulating film having a film thickness of 4 nm to 10 nm interposed therebetween. The charge storage layer can have a layered structure of an insulating film such as SiON or SiN having a film thickness of 2 nm to 3 nm and polysilicon having a film thickness of 3 nm to 8 nm. Metal such as Ru may be added to the polysilicon. An insulating film is formed on the charge storage layer. The insulating film includes, for example, a silicon oxide film having a film thickness of 4 nm to 10 nm interposed between a lower high-k film having a film thickness of 3 nm to 10 nm and an upper high-k film having a film thickness of 3 nm to 10 nm. The high-k film is made of HfO. The film thickness of the silicon oxide film may be greater than the thickness of the high-k film. A control electrode having a film thickness of 30 nm to 70 nm is formed on the insulating film with a material which has a film thickness of 3 nm to 10 nm and is used to adjust a work function interposed therebetween. Here, the material for adjusting a work function is a metal oxide film made of TaO, or a metal nitride film made of TaN. The control electrode may be made of W.

Air gaps may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
   a nonvolatile semiconductor memory cell array;
   a plurality of terminals through which control signals are received to control the memory device, the plurality of terminals including a first terminal to receive data, a second terminal to receive a clock signal, and a third terminal to receive a read enable signal;
   an on-die termination circuit connected to at least one of the first, second, and third terminals and having a variable resistor; and
   a control circuit configured to enable the on-die termination circuit in response to an enabling signal to enable the on-die termination circuit, a resistance of the variable resistor of the on-die termination circuit being set at different values depending on whether a control signal is asserted or deasserted when the enabling signal is received.

2. The memory device according to claim 1, wherein the control signal is the read enable signal, which enables a read operation in the memory device.

3. The memory device according to claim 1, further comprising:
   a memory unit that stores setting information of whether or not the on-die termination circuit is operable, wherein
   when the setting information indicates that the on-die termination circuit is set to be inoperable, the control circuit does not enable the on-die termination circuit even when the enabling signal is received.

4. The memory device according to claim 1, wherein the plurality of terminals, the on-die termination circuit, and the control circuit are included in a chip disposed on a substrate, and
   the nonvolatile semiconductor memory cell array is included in one of a plurality of semiconductor memory chips stacked on the substrate.

5. The memory device according to claim 1, wherein the nonvolatile semiconductor memory cell array, the plurality of terminals, the on-die termination circuit, and the control circuit are included in one of a plurality of semiconductor memory chips stacked on a substrate.

6. The memory device according to claim 1, wherein the control circuit enables the on-die termination circuit, only when a chip enable signal for the memory device is deasserted.

7. The memory device according to claim 1, further comprising:
   a memory unit that stores setting information of operability of the on-die termination circuit when the control signal is asserted, and
   the controller does not enable the on-die termination circuit if the setting information indicates as inoperable, even when the enabling signal is received while the control signal is asserted.

8. The memory device according to claim 1, further comprising:
   a memory unit that stores setting information of operability of the on-die termination circuit when the control signal is deasserted, and
   the controller does not enable the on-die termination circuit if the setting information indicates as inoperable, even when the enabling signal is received while the control signal is deasserted.

9. The memory device according to claim 1, wherein the on-die termination circuit includes a first switching element, the variable resistor, and a second switching element that are connected in series between a power source terminal and a ground terminal, and
   the on-die termination circuit is enabled by switching on the first and second switching elements.

10. A memory system, comprising:
    a plurality of nonvolatile semiconductor memory modules, each including:
       a plurality of terminals through which control signals are received to control the nonvolatile semiconductor memory module,
       an on-die termination circuit connected to at least one of the terminals, and
       a control circuit configured to control the on-die termination circuit; and
    a controller configured to;
       enable a first nonvolatile semiconductor memory module, and
       while the first nonvolatile semiconductor memory module is enabled, deassert a signal for enabling a second nonvolatile semiconductor memory module to disable the second nonvolatile semiconductor memory module, and transmit an enabling signal to enable the on-die termination circuit of the second nonvolatile semiconductor memory module.

11. The memory system according to claim 10, wherein the controller transmits the enabling signal to the second nonvolatile semiconductor memory module after transmitting a command to the first nonvolatile semiconductor memory module.

12. The memory system according to claim 10, wherein the controller deasserts the enabling signal to the second nonvolatile semiconductor memory module upon disabling of the first semiconductor memory module.

13. The memory system according to claim 10, wherein when the controller transmits data to be written into the first nonvolatile semiconductor memory module that is enabled, the controller transmits the enabling signal before transmitting the data to the first nonvolatile semiconductor memory module.

14. The memory system according to claim 10, wherein when the controller operates to read data from the first nonvolatile semiconductor memory module that is enabled, the controller transmits the enabling signal before the data are read from the first nonvolatile semiconductor memory module.

15. The memory system according to claim 10, wherein the controller transmits a signal to a terminal of the second nonvolatile semiconductor memory module, as a write protection signal to prohibit data writing into the second nonvolatile semiconductor memory module for a predetermined period of time after the second nonvolatile semiconductor memory module has been powered on, and as the enabling signal after the predetermined period of time.

16. The memory system according to claim 15, wherein deassertion of the enabling signal causes the second nonvolatile semiconductor memory module to prohibit data writing therein.

17. The memory system according to claim 10, wherein when data are read from the first nonvolatile semiconductor memory module that is enabled, the controller transmits the enabling signal while a read enable signal to enable data reading is asserted, and when data are written into the first nonvolatile semiconductor memory module that is enabled, the controller transmits the enabling signal while the read enable signal is deasserted.

* * * * *